United States Patent
Kushida et al.

(10) Patent No.: US 7,907,439 B2
(45) Date of Patent: Mar. 15, 2011

(54) SEMICONDUCTOR MEMORY DEVICE

(75) Inventors: Keiichi Kushida, Kawasaki (JP); Gou Fukano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 12/332,594

(22) Filed: Dec. 11, 2008

(65) Prior Publication Data

US 2009/0168499 A1 Jul. 2, 2009

(30) Foreign Application Priority Data

Dec. 28, 2007 (JP) .................. 2007-339341

(51) Int. Cl.
*G11C 11/409* (2006.01)
(52) U.S. Cl. ........ 365/156; 365/51; 365/63; 365/189.17
(58) Field of Classification Search .............. 365/189.18
See application file for complete search history.

(56) References Cited

U.S. PATENT DOCUMENTS 6,335,896 B1 * 1/2002 Wahlstrom ............... 365/230.03
6,483,765 B2 * 11/2002 Han .......................... 365/230.03

OTHER PUBLICATIONS

John Wuu, et al., "The Asynchronous 24MB On-Chip Level-3 Cache for a Dual-Core Itanium® -Family Processor", IEEE International Solid-State Circuits Conference, 2005, pp. 488-489 and 618.

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A semiconductor memory device comprises a plurality of cell arrays, each cell array containing a plurality of word lines, a plurality of bit lines crossing the word lines, and memory cells connected at intersections of the word lines and bit lines, the cell arrays arranged along the bit line; a plurality of bit line gates provided between the cell arrays and each operative to establish a connection between the bit lines in adjacent cell arrays; and a controlling circuit operative to form a data transfer path via the connection between the bit lines formed through the bit line gate when the controlling circuit accesses to the memory cell.

20 Claims, 17 Drawing Sheets

SEMICONDUCTOR MEMORY DEVICE

CROSS-REFERENCE TO RELATED APPLICATION

This application is based upon and claims the benefit of priority from the prior Japanese Patent Application No. 2007-339341, filed on Dec. 28, 2007, the entire contents of which are incorporated herein by reference.

BACKGROUND OF THE INVENTION

1. Field of the Invention

The present invention relates to a semiconductor memory device such as an SRAM.

2. Description of the Related Art

Recent SRAMs are required to have lower operating voltages and achieve high-speed operation. With this regard, a bit-line stray capacity becomes a large problem. The bit-line stray capacity is determined by memory cells and bit-line material as well as the number of cells per bit line. As a technology for reducing the number of cells per line while keeping the memory capacity, an SRAM circuit having a hierarchical bit-line structure has been proposed (Non-patent Document 1: John Wuu et. al., 2005 IEEE International Solid-State Circuits Conference, pp. 488-489, 618).

The hierarchical bit-line structure requires local bit lines for connecting memory cells with local sense amplifiers as well as global bit lines for connecting the local sense amplifiers with I/O. Therefore, it is required to provide excessive wiring layers, which cause the need for extra mask formation in comparison with the circuit having no hierarchical structure and lead to an increased cost of the entire chip.

SUMMARY OF THE INVENTION

In a first aspect the present invention provides a semiconductor memory device, comprising: a plurality of cell arrays, each cell array containing a plurality of word lines, a plurality of bit lines crossing the word lines, and memory cells connected at intersections of the word lines and bit lines, the cell arrays arranged along the bit line; a plurality of bit line gates provided between the cell arrays and each operative to establish a connection between the bit lines in adjacent cell arrays; and a controlling circuit operative to form a data transfer path via the connection between the bit lines formed through the bit line gate when the controlling circuit accesses to the memory cell.

In a second aspect the present invention provides a semiconductor memory device, comprising: a plurality of cell blocks, each cell block including a first and a second cell array, each cell array containing a plurality of word lines, a plurality of bit lines crossing the word lines, and memory cells connected at intersections of the word lines and bit lines, the first and second cell arrays arranged along the bit line, a sense amplifier circuit connected to sense nodes located between the first and second cell arrays, and a first and a second column gate arranged to connect bit lines in the first and second cell arrays to the sense nodes, the cell blocks arranged along the bit line to form an array of the cell block; an input/output controller provided on at least one side of the array of the cell blocks along the bit line and operative to control input/output of data in relation to access to the memory cell; a plurality of bit line gates provided between the cell blocks and between the input/output controller and an adjacent cell block and operative to establish connections between bit lines in adjacent cell blocks and between bit lines in the input/output controller and the adjacent cell block; a row decoder arranged on one side of the cell blocks along the word line and operative to select among the word lines; and a controlling circuit operative to form a data transfer path between the memory cell and the input/output controller via the connection between the bit lines formed through the first and second column gates and the bit line gate when the controlling circuit accesses to the memory cell.

In a third aspect the present invention provides a semiconductor memory device, comprising: a plurality of cell blocks, each cell block including a first and a second cell array, each cell array containing a plurality of word lines, a plurality of bit lines crossing the word lines, and memory cells connected at intersections of the word lines and bit lines, the first and second cell arrays arranged along the bit line, a sense amplifier circuit connected to sense nodes located between the first and second cell arrays, and a first and a second column gate arranged to connect bit lines in the first and second cell arrays to the sense nodes, the cell blocks arranged along the bit line to form an array of the cell block; an input/output controller provided on at least one side of the array of the cell blocks along the bit line and operative to control input/output of data in relation to access to the memory cell; and a plurality of bit line gates provided between the cell blocks and between the input/output controller and an adjacent cell block and operative to establish connections between bit lines in adjacent cell blocks and between bit lines in the input/output controller and the adjacent cell block, wherein access to a certain memory cell is made via a data transfer path including the bit lines, the first and second column gates and the bit line gates in the cell block arranged between a certain cell block containing the certain memory cell and the input/output controller.

DETAILED DESCRIPTION OF THE EMBODIMENTS

The embodiments associated with the semiconductor memory device according to the present invention will now be described in detail with reference to the drawings.

First Embodiment

Figure 1:
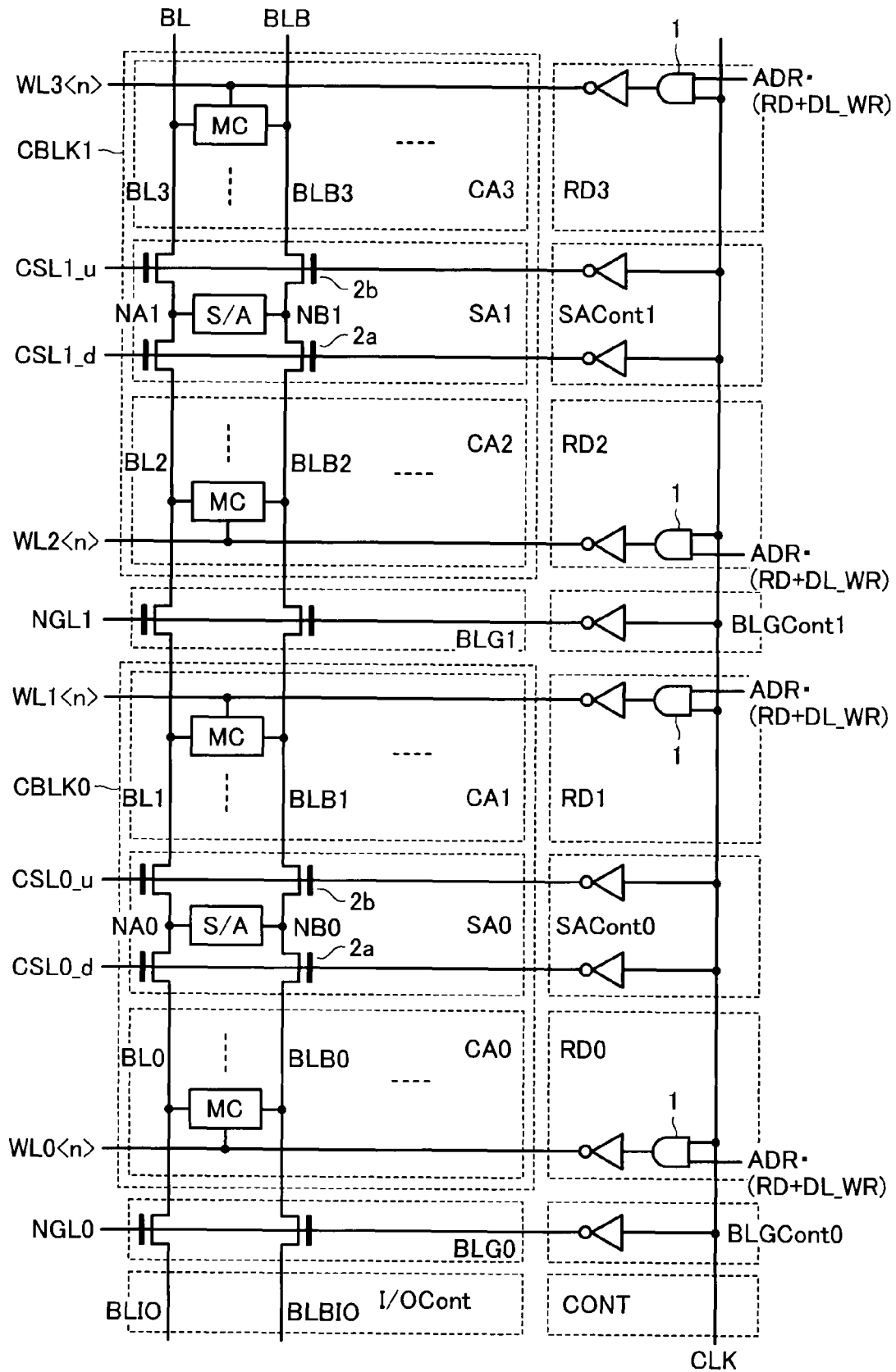
FIG. 1 is a block diagram of a semiconductor memory device according to a first embodiment of the present invention.

FIG. 1 is a block diagram of a semiconductor memory device according to a first embodiment of the present invention.

The semiconductor memory device according to the present embodiment comprises a plurality of cell blocks CBLK0, CBLK1, . . . each including a first cell array CA<i> (i is an even number), a second cell array CA<i+1>, and a sense amplifier unit SA arranged therebetween. The cell array CA contained in the cell block CBLK includes bit line pairs each containing bit lines BL, BLB extending in the longitudinal direction in the figure, word lines WL extending in the lateral direction in the figure, and memory cells MC connected at intersections thereof and arranged in matrix. The cell blocks CBLK are arrayed along the bit lines BL, BLB. On one end of the array of the cell blocks CBLK, an input/output controller I/OCont is arranged. Between the input/output controller I/OCont and a cell block CBLK0 adjacent thereto, and between the cell blocks CBLK0, CBLK1, . . . , bit line gates BLG0, BLG1, . . . are interposed respectively to form connections between the bit lines BL, BLB and adjacent ones. On one end of the array of the cell blocks CBLK0, CBLK1, . . . along the word line WL, row decoders RD0, RD1, . . . are arranged to select among the word lines WL in accordance with a row address. On one end of the sense amplifier unit SA and one end of the bit line gate BLG along the word line WL, a sense amplifier controller SACont and a bit line gate controller BLGCont are arranged, respectively. These controllers configure a controlling circuit for forming an access path to the memory cell MC in the present embodiment together with a control circuit CONT operative to control the controllers SACont, BLGCont and the input/output controller I/OCont collectively.

Figure 2:
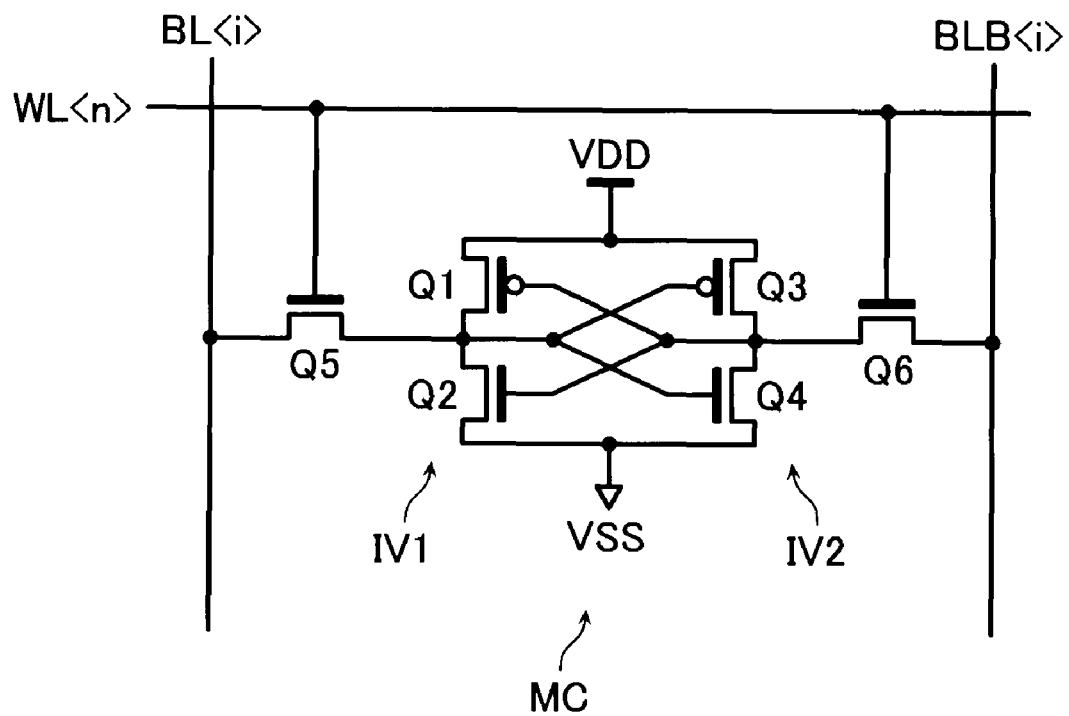
FIG. 2 is a circuit diagram of a memory cell in the same semiconductor memory device.

The memory cell MC is a memory cell of the 6-transistor type, for example, as shown in FIG. 2. Namely, the memory cell of the 6-transistor type includes a first inverter IV1 containing a PMOS transistor Q1 and an NMOS transistor Q2 complementarily connected and having sources connected to a second power supply or the supply terminal VDD and a first power supply or the ground terminal VSS, respectively. It also includes a second inverter IV2 containing a PMOS transistor Q3 and an NMOS transistor Q4 complementarily connected and having sources connected to the supply terminal VDD and the ground terminal VSS, respectively. The inputs of these inverters IV1, IV2 are cross-connected to the outputs thereof. A first transfer transistor Q5 is connected between the bit line BL and the output terminal of the first inverter IV1. A second transfer transistor Q6 is connected between the bit line BLB and the output terminal of the second inverter IV2. The first and second transfer transistors Q5, Q6 have respective gates connected to the word line WL. Writing in the memory cell of the 6-transistor type is executed with both the bit lines BL, BLB while reading may be executed only with one bit line BL as single-ended reading.

The sense amplifier unit SA includes first and second column gates 2a, 2b arranged to connect the bit lines BL, BLB in the first and second cell arrays CA with the first and second sense nodes NA and NB, and a sense amplifier circuit S/A connected between the sense nodes NA and NB and operative to sense and amplify data appeared on the sense nodes NA, NB.

Figure 3:
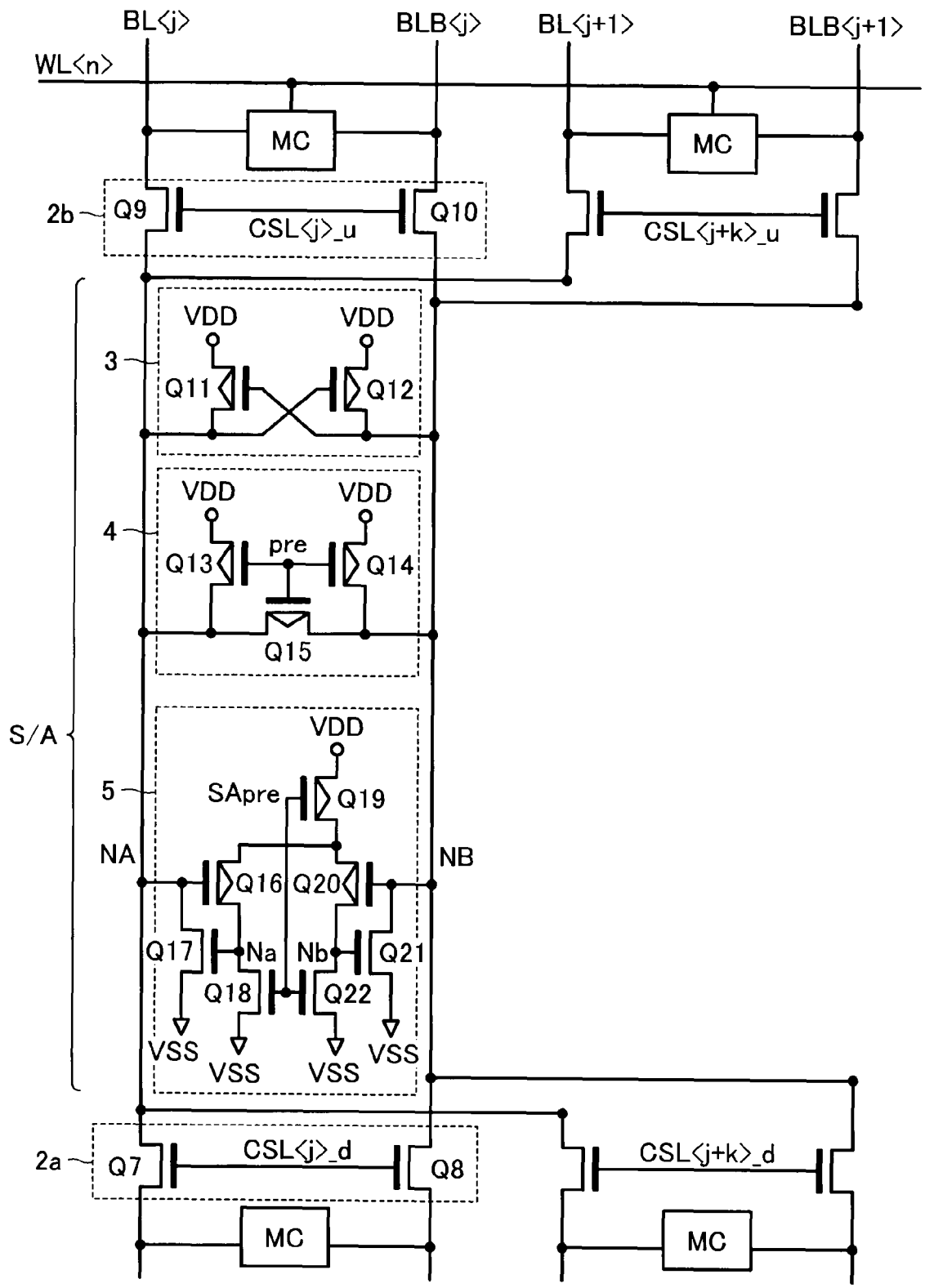
FIG. 3 is a circuit diagram showing a specific arrangement example of a sense amplifier unit in the same semiconductor memory device.

FIG. 3 is a circuit diagram showing a specific arrangement example of the sense amplifier unit SA shown in FIG. 1.

The first column gate 2a includes NMOS transistors Q7 and Q8 arranged to connect the bit lines BL and BLB in the first cell array CA<i> with the common sense nodes NA and NB. The second column gate 2b includes NMOS transistors Q9 and Q10 arranged to connect the bit lines BL and BLB in the second cell array CA<i+1> with the common sense nodes NA and NB. These first and second column gates 2a, 2b are on/off-controlled with a positive logic, column gate control signal, which is given from the sense amplifier controller SACont and fed via column gate control signal lines CSL_d and CSL_u to the gates of the PMOS transistors Q7-Q10, to connect one of the bit line pairs with the sense nodes NA, NB.

The sense amplifier circuit S/A includes a cross couple 3 configured to detect "L" level data appeared on one of the sense nodes NA and NB to pull up the other sense node, a precharge circuit 4 operative to precharge the sense nodes NA and NB to "H" level, and a self-sense circuit 5 operative to sense and amplify data appeared on the sense nodes NA and NB.

The cross couple 3 includes a PMOS transistor Q11 having a source connected to the supply terminal VDD, a drain connected to the first sense node NA, and a gate connected to the second sense node NB, and a PMOS transistor Q12 having a source connected to the supply terminal VDD, a drain connected to the second sense node NB, and a gate connected to the first sense node NA. This circuit operates in accordance with the sense node at "L" level to pull up the opposite sense node to "H" level.

The precharge circuit 4 includes three PMOS transistors Q13, Q14 and Q15 connected between the supply terminal VDD and the sense node NA, between the supply terminal VDD and the sense node NB and between the sense nodes NA and NB, respectively, and having gates supplied with a precharge signal, pre. It previously precharges the sense nodes NA and NB to "H" level on getting access to the memory cell MC. The precharge circuit 4 is controlled with a negative logic, precharge signal, pre, and activated when the signal is at "L" level.

The self-sense circuit 5 comprises first and second self-sense circuits corresponding to the sense nodes NA and NB. The first self-sense circuit includes a first transistor of the first conduction type or a PMOS transistor Q16, and second and third transistors of the second conduction type or NMOS transistors Q17 and Q18. The gate of the PMOS transistor Q16 and the drain of the NMOS transistor Q17 are connected to the sense node NA. The drain of the PMOS transistor Q16 and the gate of the NMOS transistor Q17 are connected to the drain of the NMOS transistor Q18. The source of the PMOS transistor Q16 is connected to the supply terminal VDD via a fourth transistor of the first conduction type or a PMOS transistor Q19. The sources of the NMOS transistors Q17 and Q18 are connected to the ground terminal VSS. Similarly, the second self-sense circuit includes a third transistor of the first conduction type or a PMOS transistor Q20, and third and fourth transistors of the second conduction type or NMOS transistors Q21 and Q22. The gate of the PMOS transistor Q20 and the drain of the NMOS transistor Q21 are connected to the sense node NB. The drain of the PMOS transistor Q20 and the gate of the NMOS transistor Q21 are connected to the drain of the NMOS transistor Q22. The source of the PMOS transistor Q20 is connected to the supply terminal VDD via the PMOS transistor Q19 shared with the first self-sense circuit. The sources of the NMOS transistors Q21 and Q22 are connected to the ground terminal VSS. The self-sense circuit 5 thus configured is activated with a negative logic, sense circuit control signal SApre fed to the gates of the PMOS transistor Q19 and the NMOS transistors Q18 and Q22.

The input/output controller I/OCont controls the semiconductor memory device according to the present embodiment via the bit line pair and the sense node pair for data communications with the external.

The bit line gate BLG includes a pair of NMOS transistors arranged to connect the bit lines BL, BLB with adjacent ones. These NMOS transistors have respective gates connected to a bit-line control signal line NGL extending from each bit-line gate controller BLGCont and thus they are on/off-controlled with a bit-line control signal.

The sense amplifier controller SACont is used to control the sense amplifier unit SA. Specifically, it has control of turning on/off the column gates via the column gate control signal lines CSLi_d and CSLi_u and control of activating/inactivating the sense amplifier circuit with the sense amplifier activation signal SApre.

The bit line gate controller BLGCont applies a positive logic, bit line gate control signal to a bit line gate control line NGL to on/off-control the bit line gate BLG.

The control circuit CONT controls the input/output controller I/OCont, the row decoder RD, the sense amplifier controller SACont, and the bit line gate controller BLGCont in accordance with a clock signal CLK, an address ADD, and a read/write signal R/W fed from external.

With respect to the semiconductor memory device thus configured, operation at the time of reading data from the memory cell MC is described below.

Figure 4:
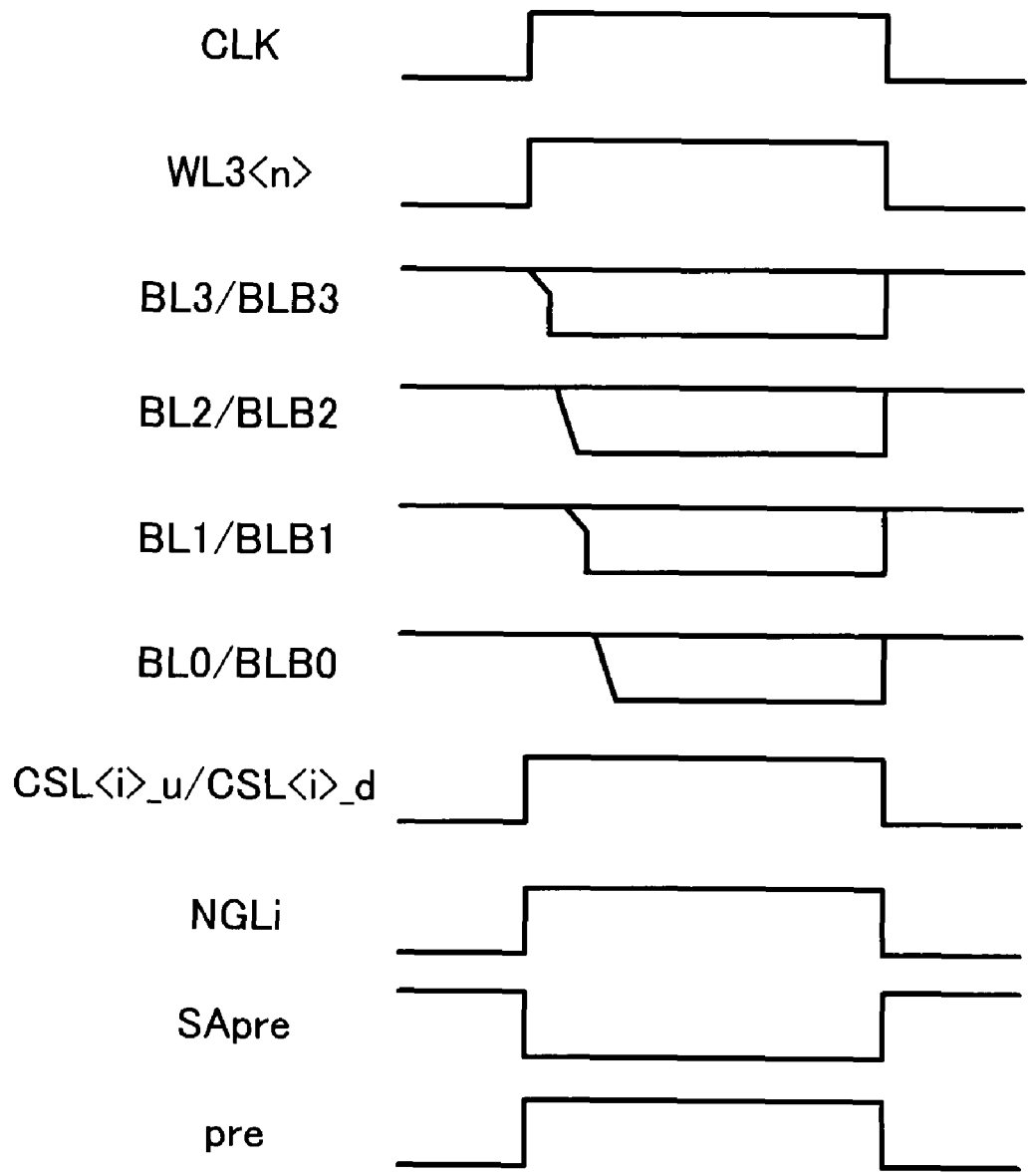
FIG. 4 is a timing chart showing signal levels on various portions in the same semiconductor memory device on data reading.

FIG. 4 is a timing chart showing signal levels on various portions in the present embodiment on data reading.

The following description is given to an example of reading data out of the memory cell MC contained in the cell array CA3.

Before the word line WL3 is selected (WL3="L" level), the precharge signal, pre, is at "L" level. Therefore, the precharge circuit 4 is activated and the sense nodes NA and NB are precharged to "H" level. The sense amplifier circuit activation signal SApre is at "H" level. Therefore, the self-sense circuit 5 is inactivated and internal nodes Na and Nb are at "L" level.

The rise of the clock signal CLK given from external is herein regarded as the starting point and the address is designated by the row decoder RD3 to select the word line WL.

Further, the column gates 2a and 2b and the bit line gate BLG in the column designated at the same time are turned on all at once. In addition, the precharge circuit 4 is inactivated and the self-sense circuit 5 is activated. If the cell node close to the bit line BL3 in the selected memory cell MC is at "H" and the cell node close to the bit line BLB3 is at "L", then the drive NMOS transistor Q4 in the memory cell MC is turned on to pull down the bit line BLB3 in the cell array CA3 to "L" level. Subsequently, when the difference in level between the column selection signal CSL1_u and the bit line BLB3 exceeds the threshold of the NMOS transistor Q10 in the column gate 2b, the NMOS transistor Q10 is turned on to pull down the cell node NB1 to "L" level. As a result, the NMOS transistor Q11 in the cross couple 3 is turned on to pull up the cell node NA1 to "H" level. In addition, the PMOS transistor Q20 in the self-sense circuit 5 in the sense amplifier unit SA1 is also turned on while the PMOS transistor Q19 is kept off at this time. Accordingly, the node Nb is turned to "H" level, which turns on the NMOS transistor Q21. Therefore, the potential on the bit line BLB3 is sharply pulled down to "L" level via the cell node NB1 and the NMOS transistor Q21. The NMOS transistor Q21 may be designed to have a larger driving force than the driving force of the transistor Q4 to reduce the time of "L" level transition.

The data on the sense nodes NA1 and NB1 thus determined turns on the next column gate 2a. Accordingly, the charge on the next bit line BLB2 is discharged via the drive NMOS transistor Q4 in the selected memory cell MC and the drive NMOS transistor Q21 in the self-sense circuit 5, and the next bit line BLB2 starts varying to "L" level. The variation in level on the next bit line BLB2 turns on the next bit line gate NGL1 and reduces the level on the next bit line BLB1. The reduction in level on the bit line BLB1 is sensed and amplified at the self-sense circuit 5 in the next sense amplifier unit SA0 and transferred to the bit lines BL0 and BLB0 in the cell array CA0.

As described above, the data read out of the memory cell MC in the cell array CA3 is transferred via the bit lines BL3, BLB3, the sense nodes NA1, NB1, the bit lines BL2, BLB2, . . . , the bit lines BL0, BLB0 to the input/output controller I/OCont, and thus the data in the memory cell MC is provided to external.

Operation at the time of data writing is described next.

Figure 5:
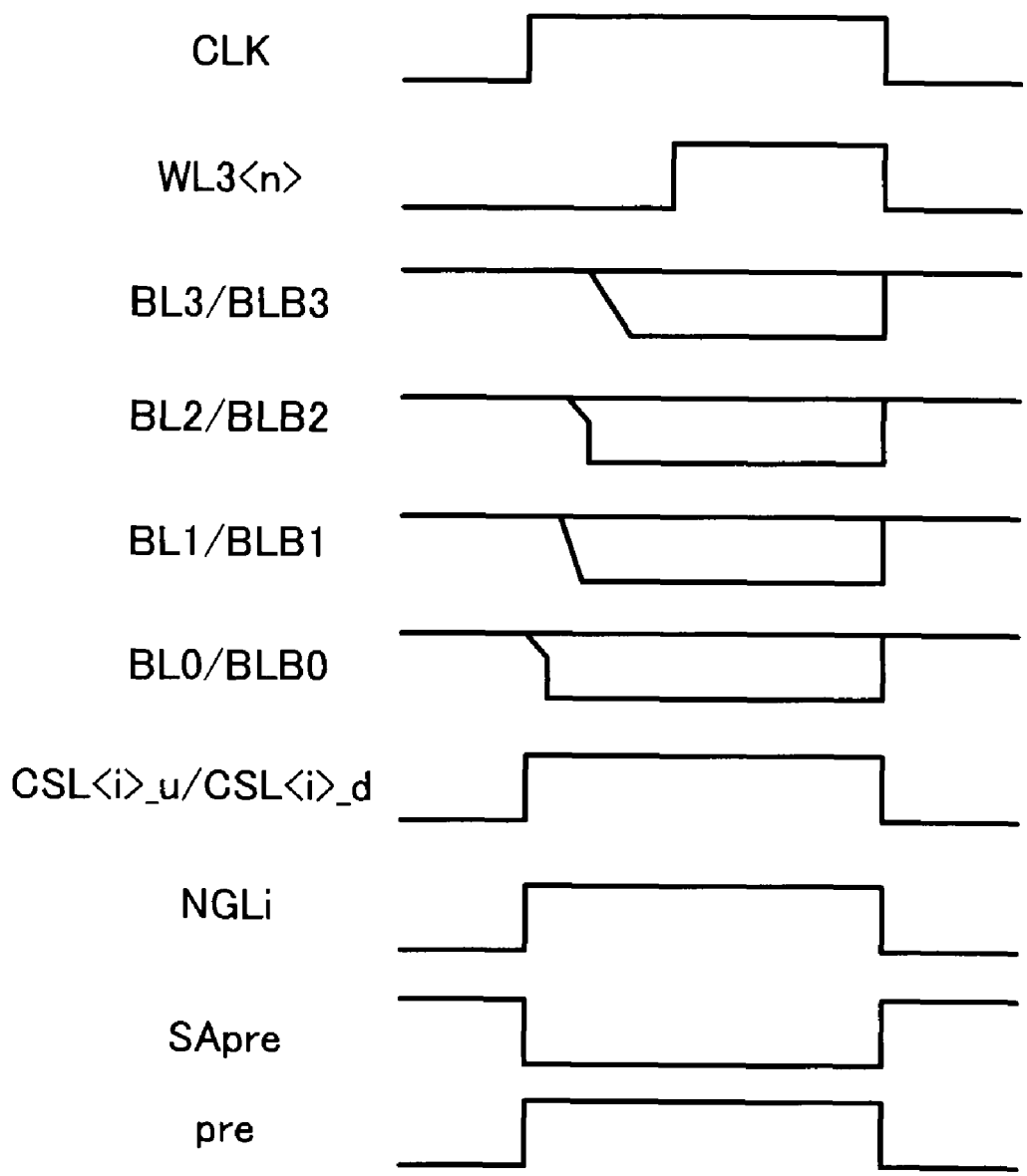
FIG. 5 is a timing chart showing signal levels on various portions in the same semiconductor memory device on data writing.

FIG. 5 is a timing chart showing signal levels on various portions in the present embodiment on data writing.

The following description is given on the assumption that data is given from external to the bit lines BL and BLB at "H" and "L" levels and the data is written in the memory cell MC contained in the cell array CA3.

The state before data writing is similar to the state before the selection of the word line WL3 at the time of data reading described above.

The rise of the clock signal CLK given from external is herein regarded as the starting point and the column gates CSL_d and CSL_u and the bit line gate BLG in the designated column are turned on all at once to activate the self-sense circuit 5 and inactivate the precharge circuit 4.

When data is given from the input/output controller I/OCont, the sense node NB0 in the sense amplifier SA0 is pulled down to "L" level via the bit line BLB0. Therefore, the PMOS transistor Q20 in the self-sense circuit 5 is turned on. Thereafter, the node Nb is connected to the supply terminal VDD via the turned-on PMOS transistor Q19 and accordingly the drive NMOS transistor Q21 is turned on. Thus, the sense node NB0 is connected to the ground terminal VSS and sharply pulled down to "L" level.

This variation transfers via the bit line BLB1 in the cell array CA1 and via the bit line gate BLG1 and appears on the bit line BLB2 in the cell array CA2, and finally on the bit line BLB3 in the cell array CA3.

After the signal levels on the bit lines BL3 and BLB3 are determined in this way, the row decoder RD3 selects the word line WL3 to hold the data in the selected memory cell MC.

In the present embodiment, the data read path from the selected memory cell MC to the input/output controller I/OCont at the time of data reading and the data write path from the input/output controller I/OCont to the selected memory cell MC at the time of data writing can be formed via the bit lines BL, BLB in the cell blocks each including a plurality of small cell arrays. Accordingly, input/output of data can be executed with no addition of global bit lines.

In the present embodiment, the use of the self-sense amplifier circuit 5 shown in FIG. 3 is effective to achieve a higher resistance to disturb. Namely, the self-sense amplifier circuit 5 can not operate until the potential on the sense node NA, NB lowers by the threshold of the PMOS transistor Q16, Q20 in the self-sense amplifier circuit 5. Accordingly, the use of the self-sense amplifier circuit 5 can make the disturb margin larger by the extent. Therefore, even if the bit line gate BLG and the column gates 2a, 2b are activated simultaneously with memory access, no disturb arises and the controlling circuit requires no timing of activating the bit line gates BLG and the column gates 2a, 2b as an advantage.

Second Embodiment

Figure 6:
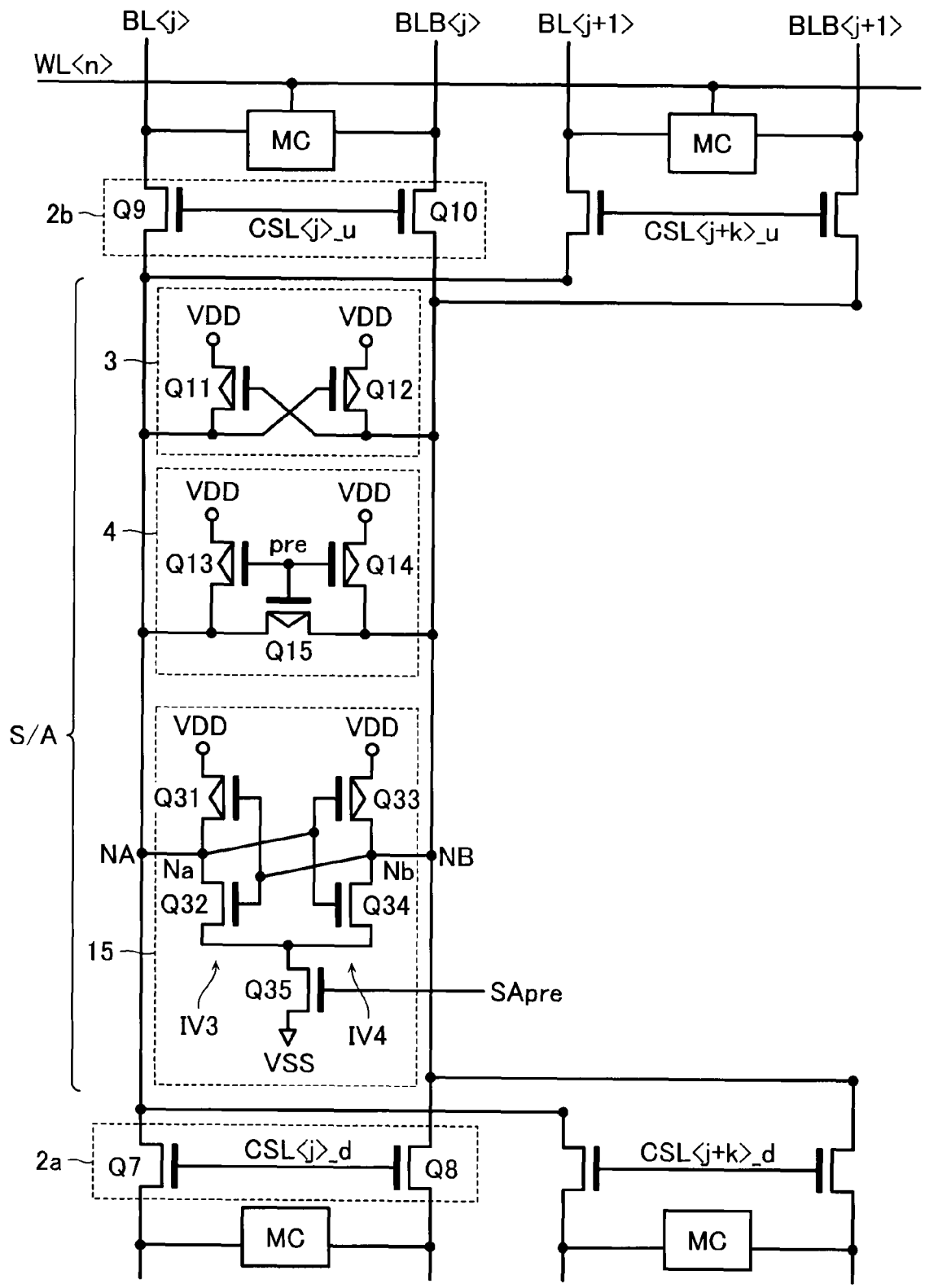
FIG. 6 is a circuit diagram of a sense amplifier circuit in a semiconductor memory device according to a second embodiment of the present invention.

FIG. 6 is a circuit diagram of a sense amplifier circuit in a semiconductor memory device according to a second embodiment of the present invention.

The present embodiment differs from the first embodiment in the use of a differential circuit 15 in place of the self-sense circuit 5 in the sense amplifier circuit S/A shown in FIG. 3.

The differential circuit 15 comprises an inverter TV3 including a load PMOS transistor Q31 having a source connected to the supply terminal VDD, and a drive NMOS transistor Q32 having a drain connected to the drain of the former. It also comprises an inverter IV4 including a load PMOS transistor Q33 having a source connected to the supply terminal VDD, and a drive NMOS transistor Q34 having a drain connected to the drain of the former. The inverter IV3 has an input terminal and an output terminal mutually connected to the output terminal and the input terminal of the inverter IV4. The output terminal of the inverter IV3 and the input terminal of the inverter IV4 are connected to the first sense node NA. The input terminal of the inverter IV3 and the output terminal of the inverter IV4 are connected to the second sense node NB. The drive NMOS transistors Q32 and Q34 are connected to the ground terminal VSS via a switch means or a PMOS transistor Q35. The differential circuit 15 thus configured is activated with the sense amplifier activation signal SApre, which is given from the sense amplifier controller SACont contained in the controlling circuit and fed to the gate of the PMOS transistor Q35.

With respect to the semiconductor memory device thus configured, operation at the time of reading data from the memory cell MC is described below.

Figure 7:
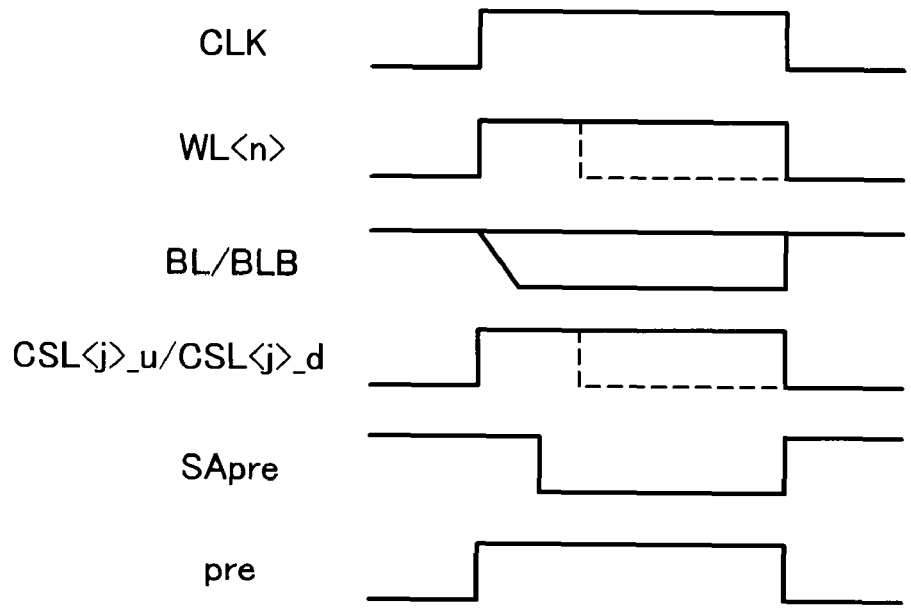
FIG. 7 is a timing chart showing signal levels on various portions in the same semiconductor memory device on data reading.

FIG. 7 is a timing chart showing signal levels on various portions in the present embodiment on data reading.

The following description is given on the assumption that the cell node in the memory cell MC connected to the bit line BL holds "H" level and the other cell node holds "L" level.

Before the word line WL is selected (WLi="H" level), the precharge circuit is activated (pre="H" level) and the differential circuit 15 is inactivated (SApre="L" level). Therefore, the nodes Na and Nb in the differential circuit 15 are both at "H" level.

When the row decoder RD selects the word line WL, the drive NMOS transistor Q4 in the memory cell MC selected by the word line WL turns on. As a result, the charge on the bit line BLB is discharged via the transistor Q4 and the level on the bit line BLB slowly varies to "L" level. The variation in level on the bit line BLB appears on the sense node NB via the column gate 2b.

When the differential circuit 15 is activated (the sense amplifier activation signal SApre="H") in this state, differential amplification by the differential circuit 15 sharply pulls down the sense node NB to "L" level and pulls up the sense node NA to "H" level.

The data thus latched is transferred via the sense nodes NA and NB to the bit lines BL and BLB in an adjacent cell array in turn, then to the input/output controller I/OCont, and read out to external.

Operation at the time of data writing is described next.

Figure 8:
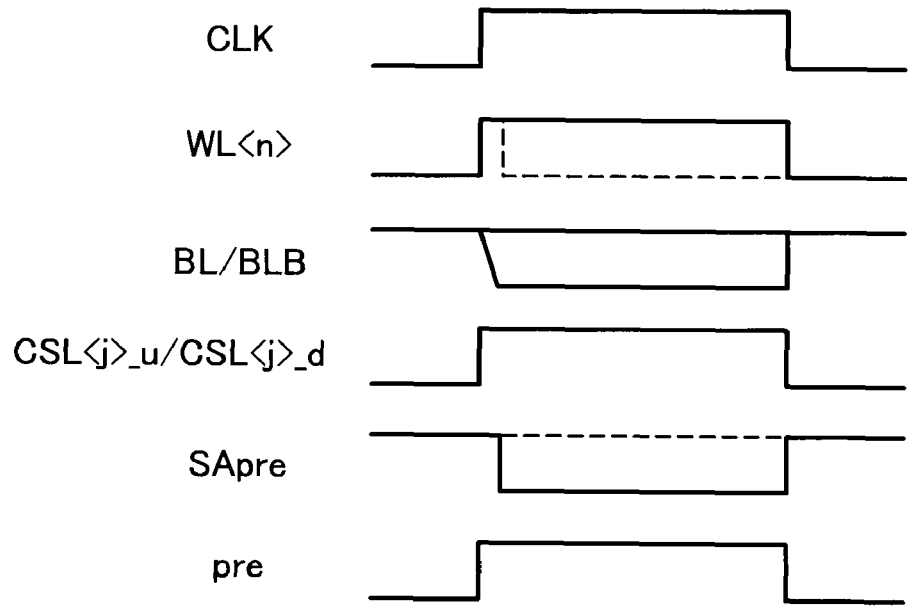
FIG. 8 is a timing chart showing signal levels on various portions in the same semiconductor memory device on data writing.

FIG. 8 is a timing chart showing signal levels on various portions in the present embodiment on data writing.

As shown, writing data in the memory cell MC has the same principle as operation at the time of data reading described above except that data is transferred from external via the bit lines BL and BLB and the sense nodes NA and NB toward the memory cell MC.

In the present embodiment, disturb may possibly arise if the differential circuit 15 is activated before data on the sense nodes NA and NB is determined. If the differential circuit 15 is activated at certain timing of determining data on the sense nodes NA and NB, though, even a slight variation in signal level on the bit line can be sensed and amplified. Therefore, the data access speed can be made higher than that in the preceding embodiment.

Third Embodiment

Figure 9:
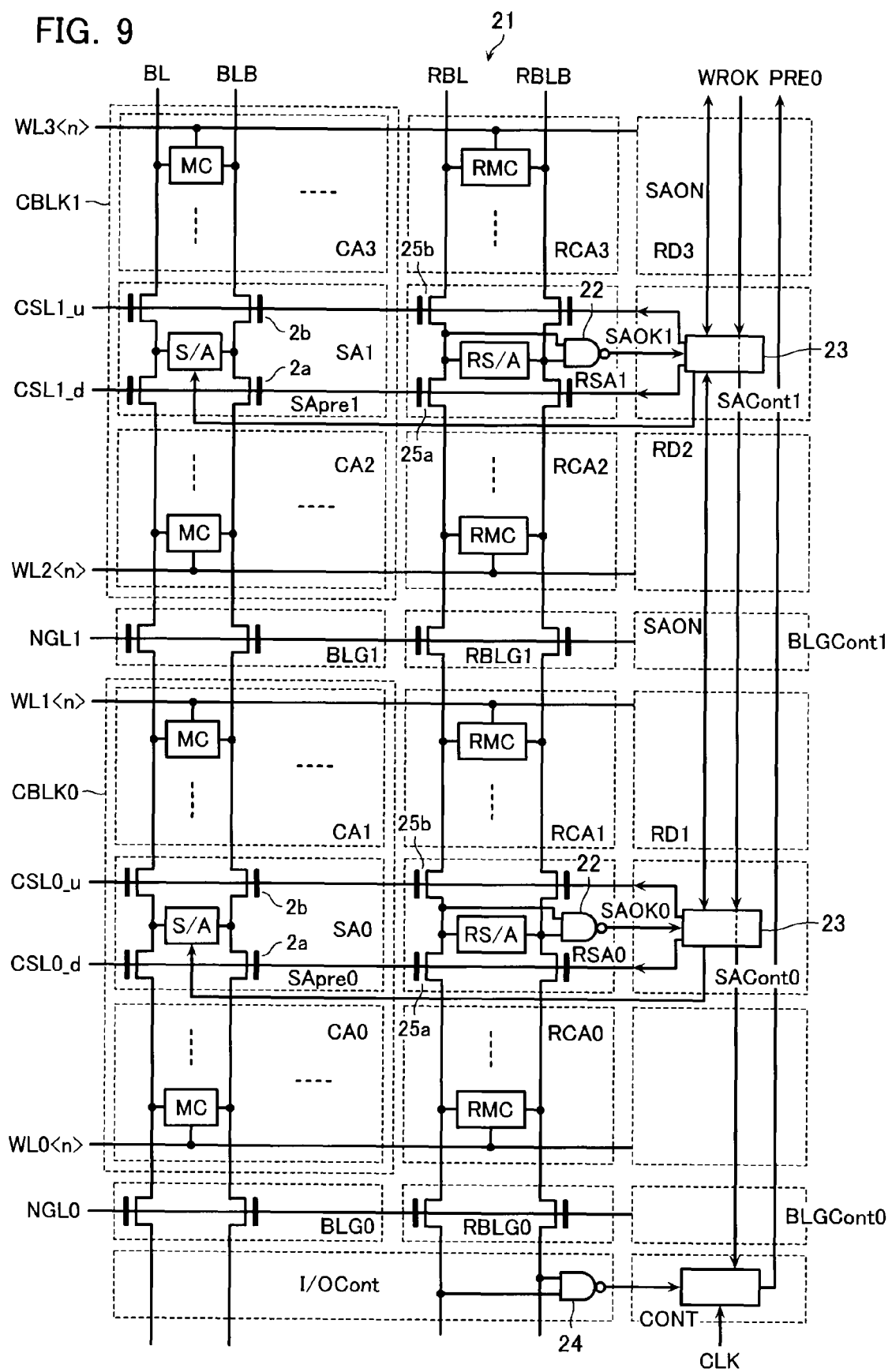
FIG. 9 is a block diagram of a semiconductor memory device according to a third embodiment of the present invention.

FIG. 9 is a block diagram of a semiconductor memory device according to a third embodiment of the present invention.

In addition to the controlling circuit in the semiconductor memory device according to the first embodiment, the present embodiment includes a means operative to control the gates such as the first and second column gates 2a, 2b and the bit line gates BLG sequentially with certain delay times in accordance with the direction of data transfer.

The timings of activating the gates may be determined sequentially with certain delay processes. Preferably, they may be determined after data in relation to access from the sense amplifier unit is determined.

The present embodiment further includes a replica circuit 21 and a transfer permission circuit 23 additionally as such the controlling circuit operative to control the gate activation timings.

The replica circuit 21 is provided between the cell block CBLK and the row decoder RD and comprises replica cell arrays RCA0, RCA1, . . . , and replica sense amplifier units RSA0, RSA1, . . . .

The replica cell array RCA shares the word lines WL with the cell array CA and includes replica bit lines RBL and RBLB extending in parallel with the bit lines BL and BLB in the cell array CA and crossing the word lines WL. There are replica memory cells RMC configured equal to the memory cell MC and connected at intersections of the word lines WL and the bit lines BL and BLB.

The replica sense amplifier unit RSA is configured equal to the sense amplifier unit SA and includes first and second replica column gates 25a, 25b, a pair of replica sense nodes connected to the replica bit lines RBL and RBLB via the replica column gates 25a, 25b, and a replica sense amplifier circuit RS/A connected to the paired replica sense nodes. The replica sense amplifier circuit RS/A is configured similar to the sense amplifier circuit S/A shown in FIG. 3 or 6.

The replica column gates 25a, 25b and the replica sense amplifier circuit RS/A are controlled simultaneously with the column gates 2a, 2b and the sense amplifier circuit S/A in the sense amplifier unit SA, respectively. In a word, the replica column gates 25a, 25b are controlled from the sense amplifier controller SACont via the column gate control signal lines CSL_d and CSL_u. The replica sense amplifier circuit RS/A is controlled for activation/inactivation with the precharge activation signal, pre, and the sense amplifier activation signal, SApre, fed from the sense amplifier controller SACont.

In addition to the above configuration, the replica sense amplifier circuit RSA includes an NAND gate 22 operative to receive two signal levels on the paired replica sense nodes.

The output signal from the NAND gate 22 or a sense amplifier completion signal SAOK is transferred to the transfer permission circuit 23. The sense amplifier completion signal SAOK is a signal for notifying that the level of data in the replica memory cell RMC sufficiently appears on the paired replica sense nodes, that is, the replica sense amplifier circuit RS/A determines the data.

The replica circuit 21 including the replica cell array RCA and the replica sense amplifier circuit RSA has the capacitance and resistance equal to the cell block CBLK and is characterized that the sense timing can be controlled equal to the cell block CBLK.

The transfer permission circuit 23 receives the sense amplifier completion signal SAOK and issues a sense amplifier activation permission signal SAON to an adjacent sense amplifier controller SACont. This signal is used to turn on the column gates 2a and 2b in an adjacent sense amplifier SA to activate the sense amplifier circuit S/A.

Operation at the time of reading data from the memory cell MC in the semiconductor memory device thus configured is described below.

Figure 10:
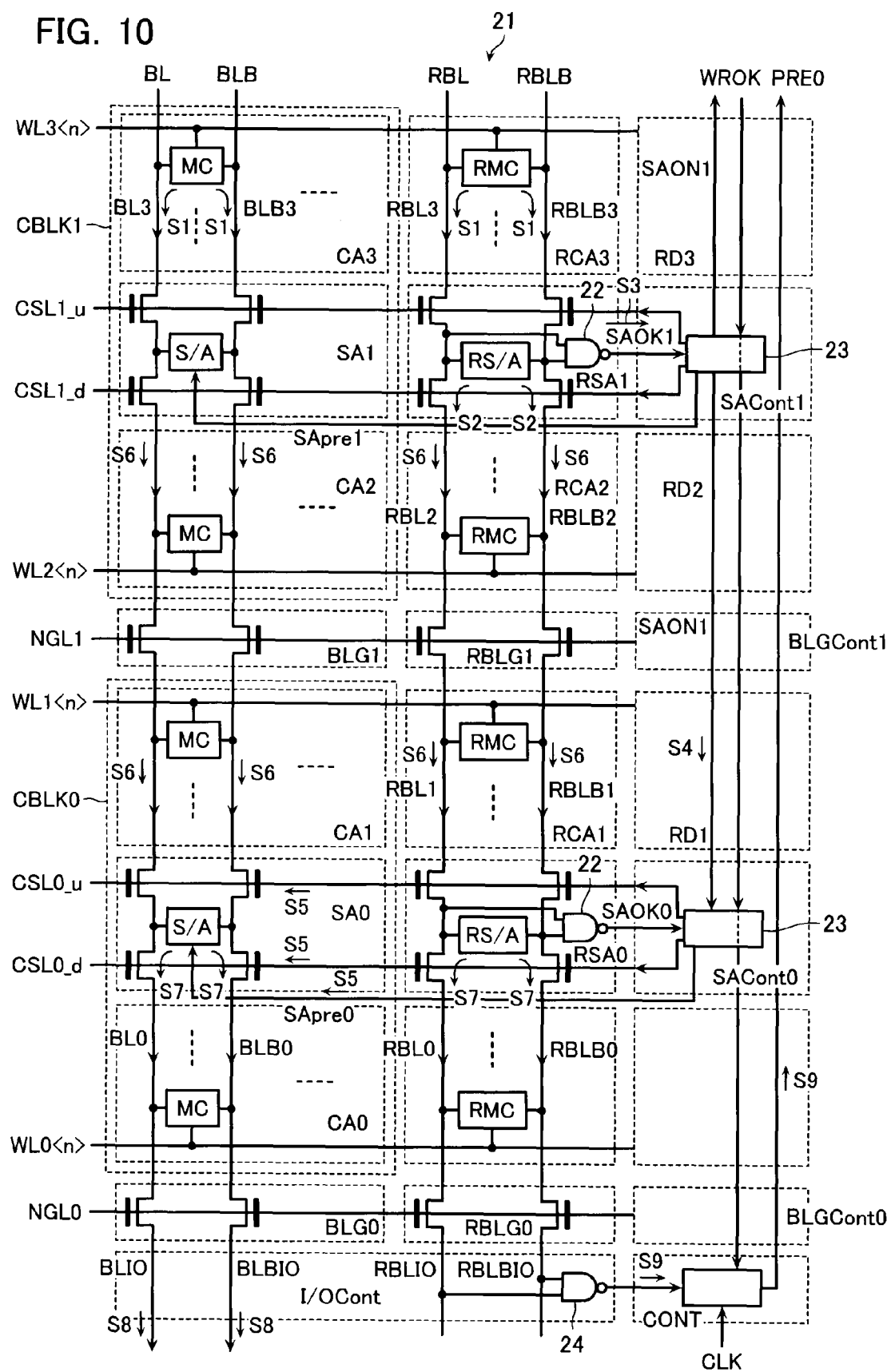
FIG. 10 is a brief diagram of operation in the same semiconductor memory device on data reading.
Figure 11:
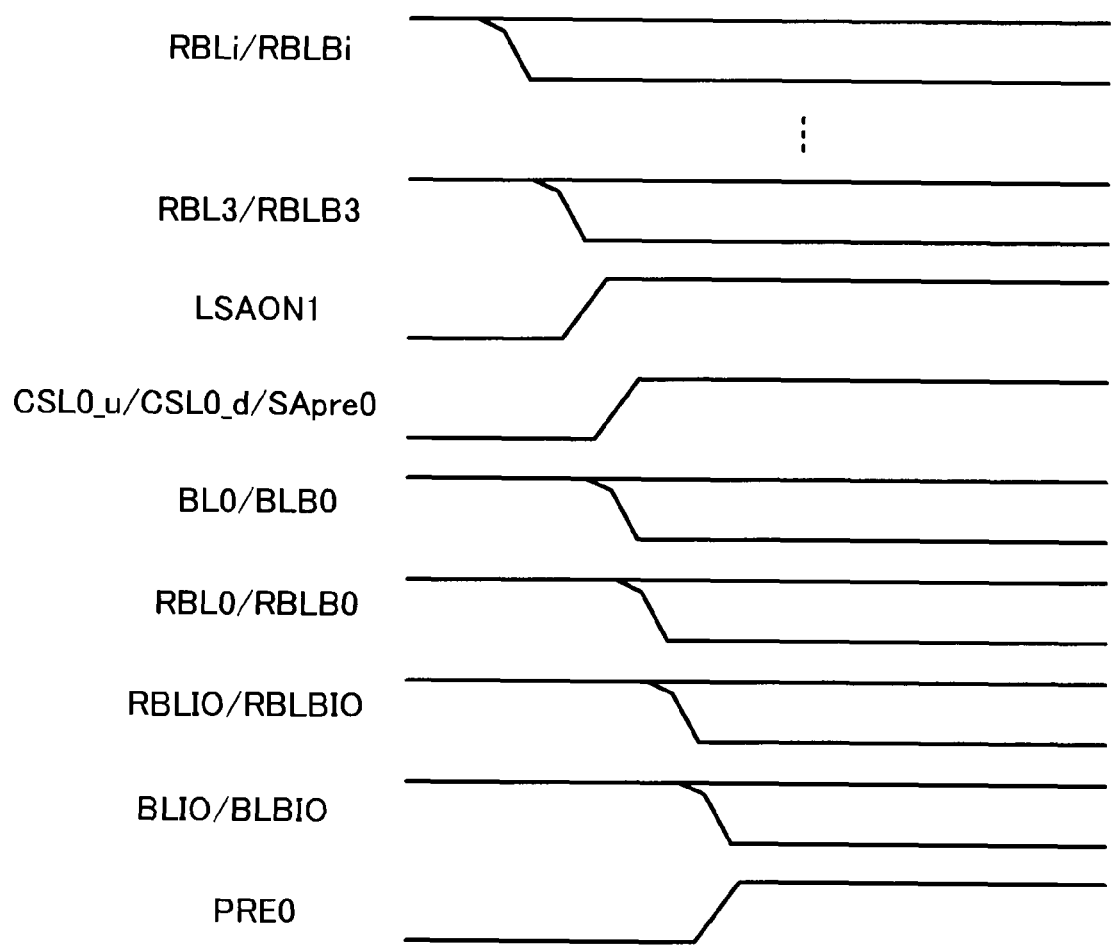
FIG. 11 is a timing chart showing signal levels on various portions in the same semiconductor memory device on data reading.

FIG. 10 is a brief diagram of operation in the present embodiment on data reading. FIG. 11 is a timing chart showing signal levels on various portions on data reading.

The following description is given to an example of reading data out of the memory cell MC contained in the cell array CA3.

First, when the word line WL3 is selected by the row decoder RD3, data in the memory cell MC and data in the replica memory cell RMC can be given to the bit lines BL3 and BLB3 and the replica bit lines RBL3 and RBLB3, respectively (S1). The data appeared on the replica bit lines RBL3 and RBLB3 is transferred to the paired replica sense nodes and amplified at a replica sense amplifier circuit contained in the replica sense amplifier unit RSA1 (S2). Subsequently, when a sufficient difference in level appears between the paired replica sense nodes, the NAND gate 22 feeds the sense amplifier completion signal SAOK1 to the transfer permission circuit 23 (S3). On reception of the sense amplifier completion signal SAOK1, the transfer permission circuit 23 issues the sense amplifier activation permission signal SAON to the transfer permission circuit 23 contained in an adjacent sense amplifier controller SACont0 (S4). On reception of the sense amplifier activation permission signal SAON, a bit line gate transfer permission circuit 44 turns on the column gates in the sense amplifier unit CA0 contained in the cell block CBLK0 to activate the sense amplifier S/A. At the same time, the replica column gates in the replica sense amplifier unit RSA0 are turned on to activate the replica sense amplifier RS/A (S5).

Until now, the data in the memory cell MC contained in the selected cell array CA3 transfers via the sense amplifier SA1, the bit lines BL2 and BLB2 in the cell array CA2, the bit line gate BLG1, and the bit lines BL1 and BLB1 in the cell array CA1 and appears on the sense nodes NA and NB in the sense amplifier SA0. On the other hand, the data in the replica cell RMC contained in the replica cell array RCA3 transfers via the replica sense amplifier RSA1, the replica bit lines RBL2 and RBLB2 in the replica cell array RCA2, the replica bit line gate RBLG1, and the replica bit lines RBL1 and RBLB1 in the replica cell array RCA1 and appears on the paired replica sense nodes in the replica sense amplifier RSA0 (S6).

The data appeared on the sense nodes NA and NB in the sense amplifier SA0 and the data appeared on the paired replica sense nodes in the replica sense amplifier RSA0 can be amplified at the activated sense amplifier circuit S/A and replica sense amplifier circuit RS/A and supplied into the bit lines BL0 and BLB0 in the cell array and the replica bit lines RBL0 and RBLB0 adjacent thereto (S7).

Through the above operation, the data in the memory cell MC in the cell array CA3 is led to the input/output controller I/OCont and provided to external (S8).

On the other hand, the data in the replica memory cell RMC in the replica cell array RCA3 is fed into an NAND gate 24 in the input/output controller I/OCont. The output from the NAND gate 24 is used to notify the control circuit CONT of the termination of reading and, on reception of this, the control circuit CONT issues a precharge control signal PRE0 to the sense amplifier controllers SACont (S9). The precharge control signal PRE0 is a signal used to instruct all the sense amplifier controllers SACont to precharge the bit lines BL and BLB and the replica bit lines RBL and RBLB. As a result, all the bit lines BL and BLB and the replica bit lines RBL and RBLB are precharged to "H" level and provided for reading and writing the next data.

Next, data writing is described below.

Figure 12:
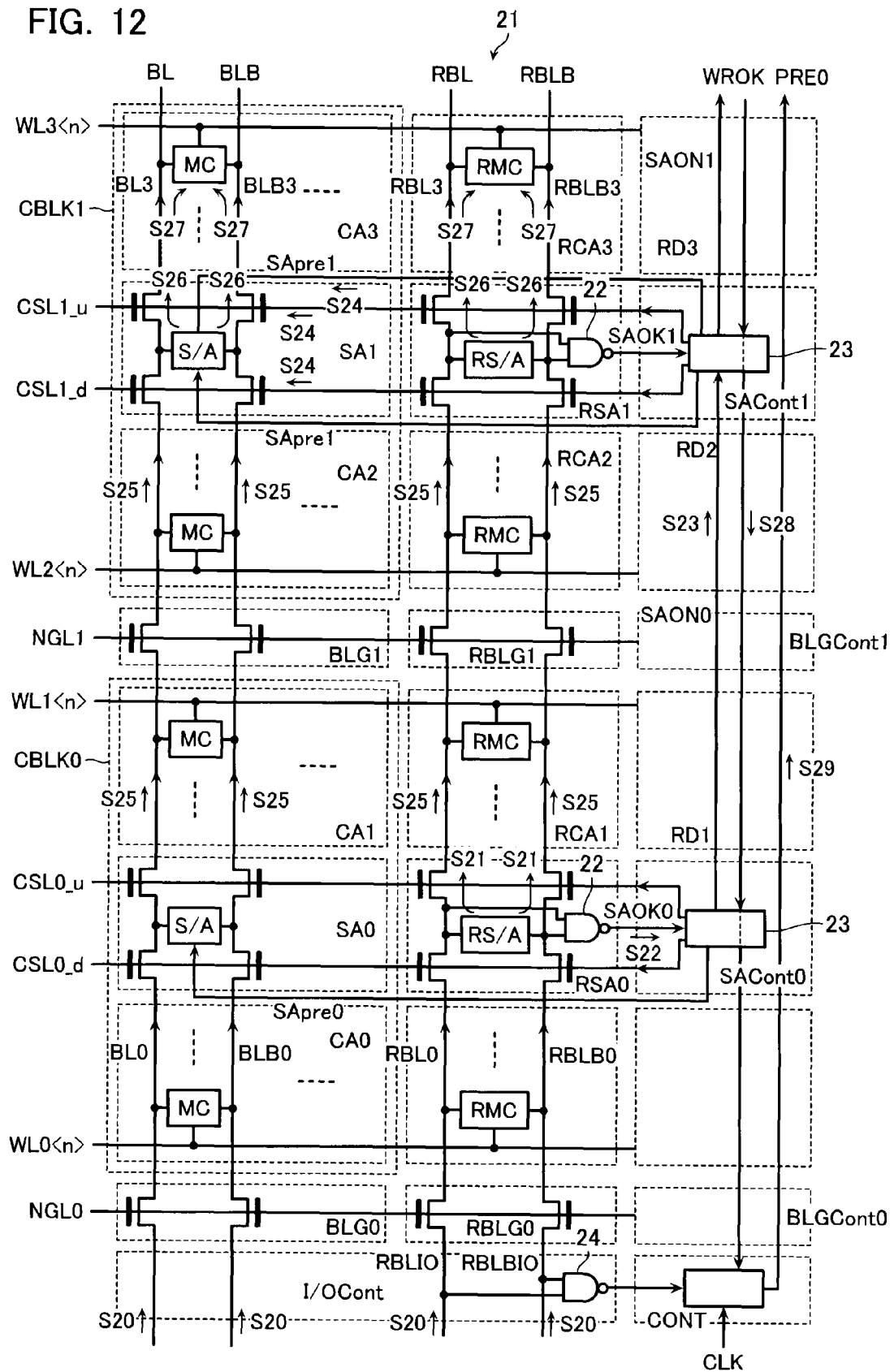
FIG. 12 is a brief diagram of operation in the same semiconductor memory device on data writing.
Figure 13:
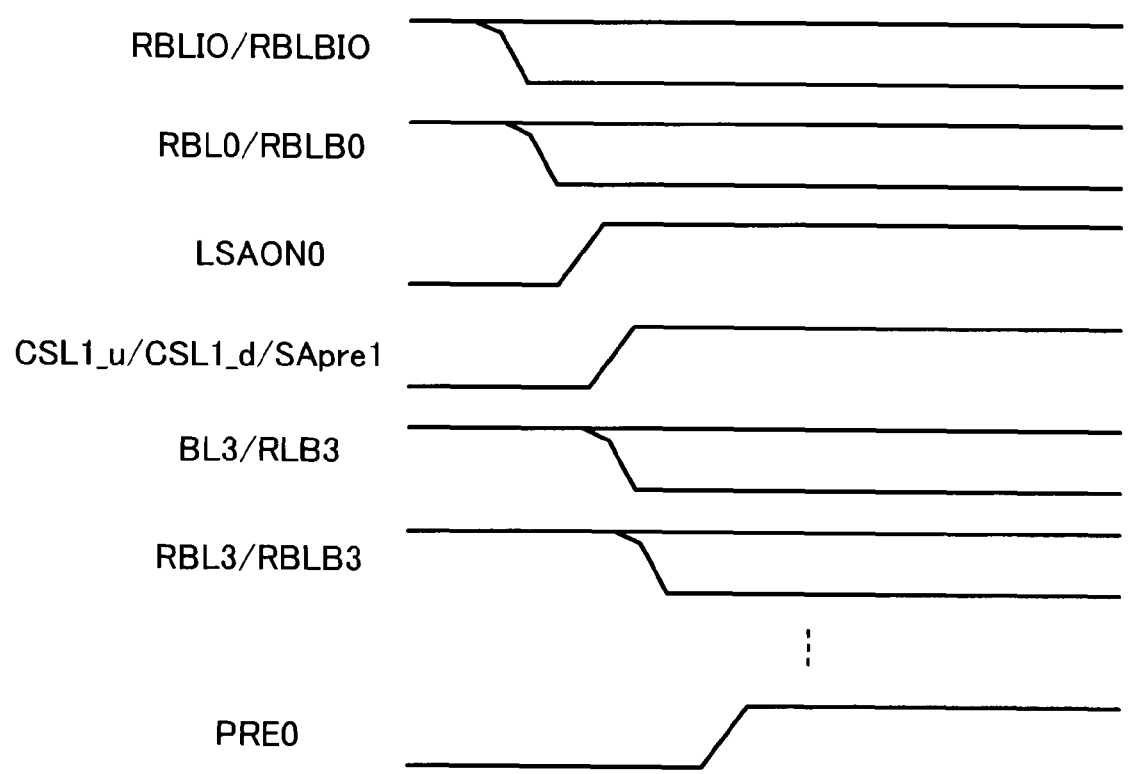
FIG. 13 is a timing chart showing signal levels on various portions in the same semiconductor memory device on data writing.

FIG. 12 is a brief diagram of operation in the present embodiment on data writing. FIG. 13 is a timing chart showing signal levels on various portions on data writing.

First, the data fed to the input/output controller I/OCont transfers via the bit line gate BLG0, and the bit lines BL0 and BLB0 in the cell array CA0 and reaches the sense nodes NA and NB in the sense amplifier unit SA0. On the other hand, in the replica circuit 21, the data transfers via the replica bit line gate RBLG0 and the replica bit lines RBL0 and RBLB0 in the replica cell array RCA0 and reaches the paired replica sense nodes in the replica sense amplifier unit RSA0 (S20). The data on the paired replica sense nodes is amplified at the replica sense amplifier circuit RS/A contained in the replica sense amplifier unit RSA0 (S21). Subsequently, when data appears at a sufficient level on the replica sense nodes, the NAND gate 22 feeds the sense amplifier completion signal SAOK0 to the transfer permission circuit 23 (S22). On reception of the sense amplifier completion signal SAOK0, the transfer permission circuit 23 issues the sense amplifier activation permission signal SAON0 to the transfer permission circuit 23 contained in an adjacent sense amplifier controller SACont1 (S23). On reception of the sense amplifier activation permission signal SAON0, the transfer permission circuit 23 in the sense amplifier controller SACont1 turns on the column gates in the sense amplifier unit CA1 contained in the cell block CBLK1 to activate the sense amplifier circuit S/A. At the same time, the replica column gates in the replica sense amplifier unit RSA1 are turned on to activate the replica sense amplifier circuit RS/A (S24).

Until now, the data fed from external transfers via the bit lines BL0 and BLB0 in the cell array CA0, the sense amplifier SA0, and the bit lines BL1 and BLB1 in the cell array CA1, the bit line gate BLG1, and the bit lines BL2 and BLB2 in the cell array CA2 and appears on the sense nodes NA and NB in the sense amplifier SA1. On the other hand, also in the replica circuit 21, the data transfers via the replica bit lines RBL0 and RBLB0 in the replica cell array RCA0, the replica sense amplifier RSA0, the replica bit lines RBL1 and RBLB1 in the replica cell array RCA1, the replica bit line gate RBLG1, and the replica bit lines RBL2 and RBLB2 in the replica cell array RCA2 and appears on the paired replica sense nodes in the replica sense amplifier unit RSA1 (S25).

The data appeared on the sense nodes NA and NB in the sense amplifier SA1 and the data appeared on the paired replica sense nodes in the replica sense amplifier RSA1 can be amplified at the activated sense amplifier circuit S/A and replica sense amplifier circuit RS/A and supplied into the bit lines BL3 and BLB3 in the cell array CA3 and the replica bit lines RBL3 and RBLB3 in the replica cell array RCA3 adjacent thereto (S26).

Thus, the data reaches the bit lines BL and BLB in the cell array CA3 and is written in the memory cell MC in the cell array CA3 when the word line WL3 is selected (S27).

Thereafter, the row decoder RD3 issues a write termination signal WROK to the control circuit CONT (S28). This signal is used to notify the completion of write to the selected memory cell MC and, on receipt of this, the control circuit CONT provides the precharge control signal PRE0 and provides for the next data read and write (S29).

The present embodiment uses no global bit line and accordingly makes it possible to achieve input/output of data without resulting in an increase in wiring layer.

Further, the input/output data to/from a memory cell is determined in a cell block and then transferred to an adjacent cell block. Therefore, data disturb can be prevented from arising in a sense amplifier circuit located therebetween.

Fourth Embodiment

Figure 14:
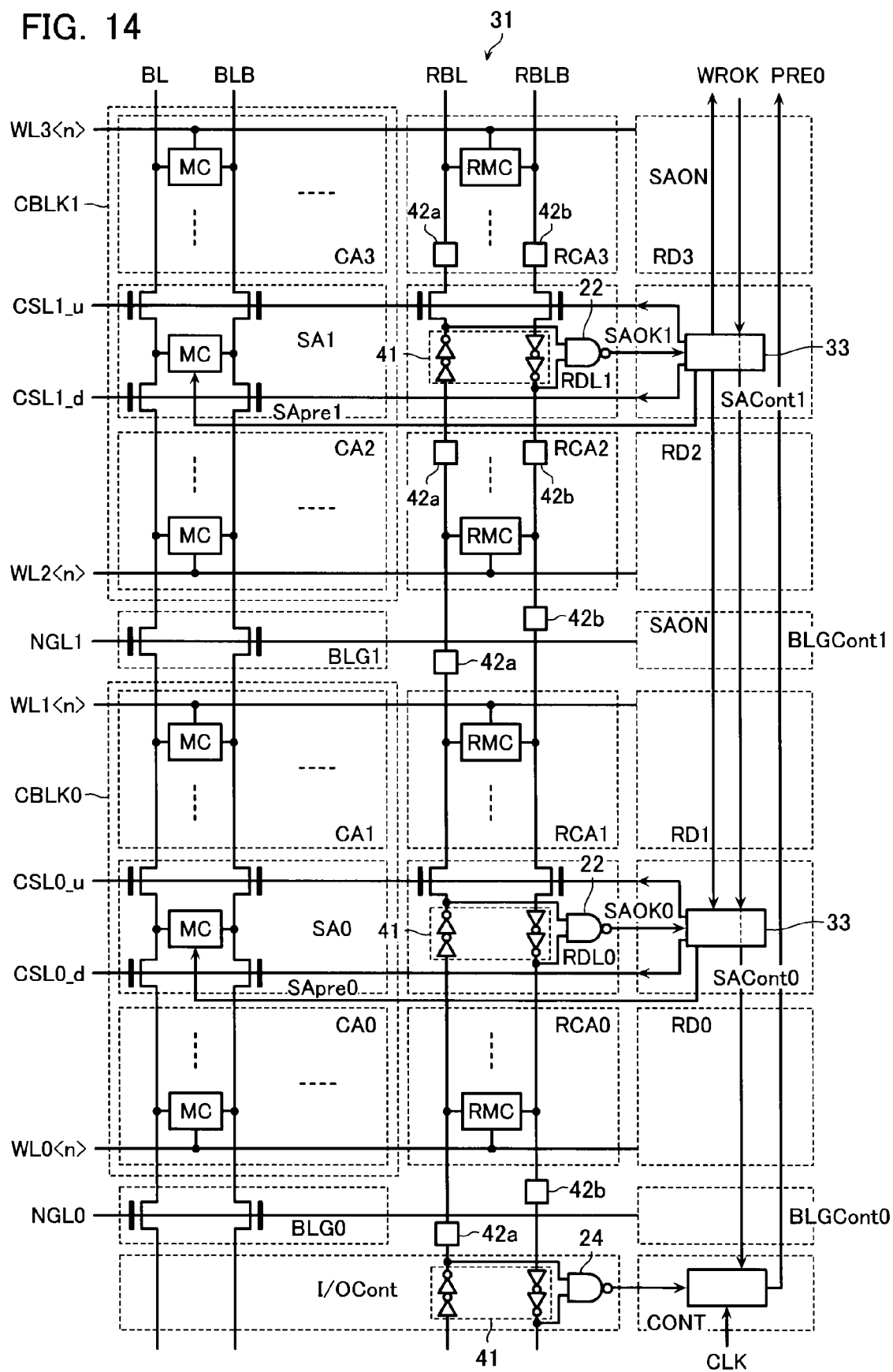
FIG. 14 is a block diagram of a semiconductor memory device according to a fourth embodiment of the present invention.
Figure 15:
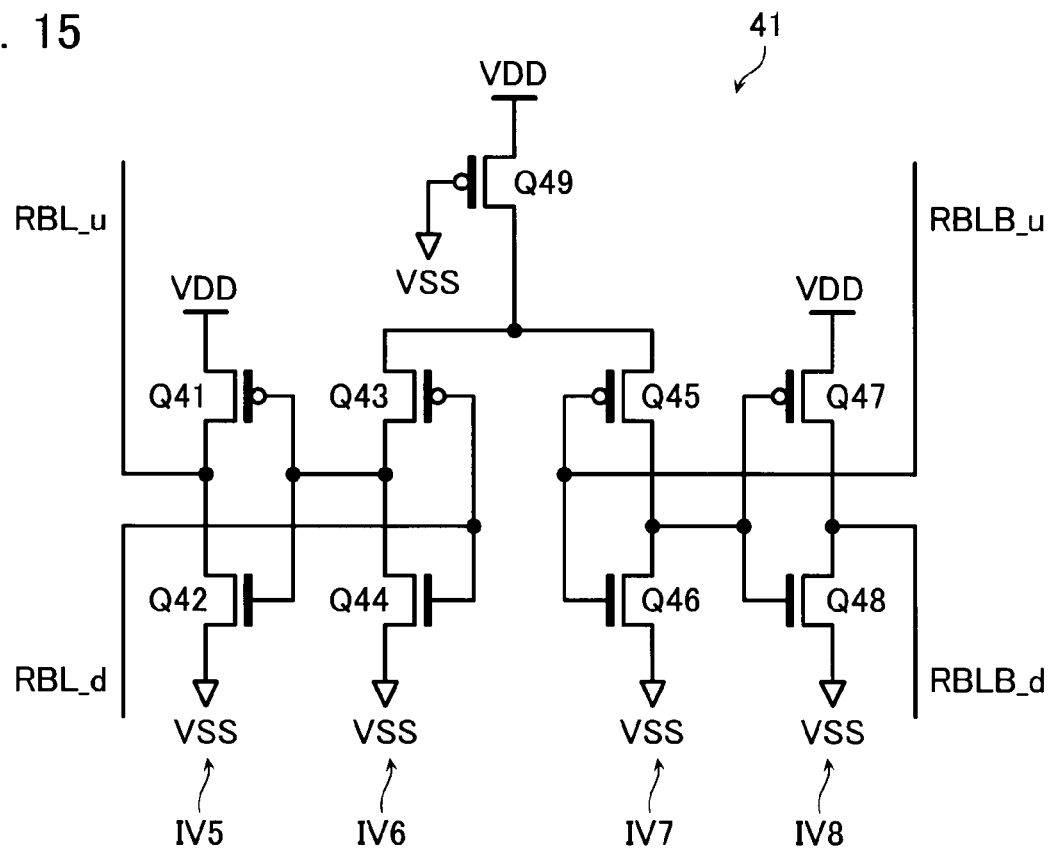
FIG. 15 is a circuit diagram of a replica delay circuit in the same semiconductor memory device.
Figure 16:
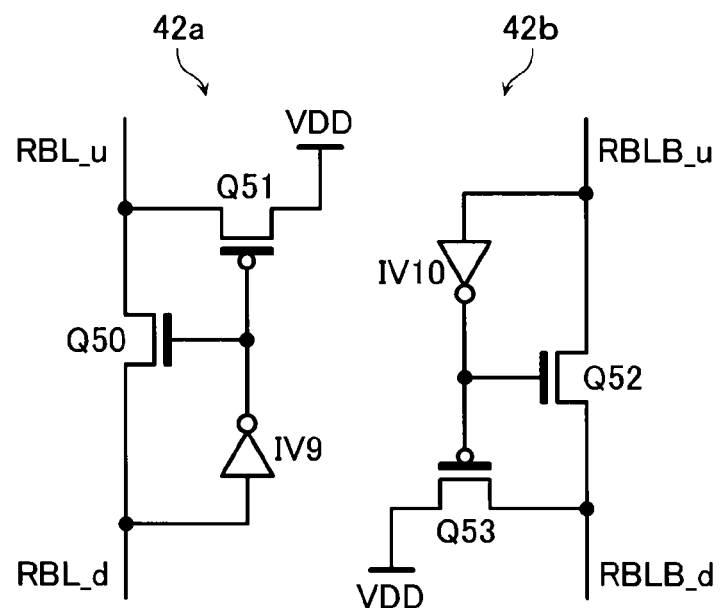
FIG. 16 is a circuit diagram of a static circuit in the same semiconductor memory device.

FIG. 14 is a block diagram of a semiconductor memory device according to a fourth embodiment of the present invention. FIGS. 15 and 16 are circuit diagrams of a replica delay circuit and a static circuit shown in FIG. 14.

The present embodiment replaces the replica sense amplifier circuit RS/A by a replica delay circuit 41 and includes static circuits 42 in the replica bit lines RBL and RBLB. In addition, the replica bit lines RBL and RBLB are used to transfer data in one direction and used properly in data read and write, different from the third embodiment.

The replica bit lines RBL and RBLB are split and the replica delay circuit 42 is connected therebetween. The circuit comprises an inverter IV5 including a PMOS transistor Q41 and an NMOS transistor Q42 connected thereto, an inverter IV6 including a PMOS transistor Q43 and an NMOS transistor Q44 connected thereto, an inverter IV7 including a PMOS transistor Q45 and an NMOS transistor Q46 connected thereto, and an inverter IV8 including a PMOS transistor Q47 and an NMOS transistor Q48 connected thereto. The input terminal of the inverter IV6 is connected to a replica bit line RBL_d and the output from the inverter IV6 is fed to IV5. The output terminal of IV5 is connected to a replica bit line RBL_U. Similarly, the input terminal of the inverter IV7 is connected to the replica bit line RBLB_u and the output from the inverter IV7 is fed to IV8. The output terminal of IV8 is connected to a replica bit line RBLB_d.

Two pairs of inverters IV5 and IV6 and inverters IV7 and IV8 have the same delay time as that of the sense amplifier circuit S/A.

The static circuits 42 are such circuits that make the dynamic circuits, or the replica bit lines RBL and RBLB, be static. There are first and second static circuits 42a and 42b provided in the replica bit lines RBL and RBLB, respectively.

The first static circuit 42a includes a PMOS transistor Q51, a PMOS transistor Q52 having a source connected to the supply terminal VDD and a drain connected to the drain of the NMOS transistor Q51, and an inverter IV9 having an input terminal connected to the source of the NMOS transistor Q51 and an output terminal connected to the gates of the NMOS transistor Q51 and the PMOS transistor Q52. The NMOS transistor Q51 is interposed in the replica bit line RBL, with the source connected to the replica bit line RBL_d and the drain to the replica bit line RBL_U.

The second static circuit 42b includes a PMOS transistor Q54, a PMOS transistor Q53 having a drain connected to the drain of the NMOS transistor Q54, and an inverter IV10 having an input terminal connected to the source of the NMOS transistor Q53 and an output terminal connected to the gates of the NMOS transistor Q53 and the PMOS transistor Q54. The NMOS transistor Q53 is interposed in the replica bit line RBLR, with the source connected to the replica bit line RBLB_U and the drain to the replica bit line RBLB_d.

The MOS transistors contained in the static circuit 42 have the same size as the MOS transistors contained in the cell block CBLK. This makes the replica bit line capacity equal to the capacity on the replica bit lines RBL and RBLB in the third embodiment.

The present embodiment uses no global bit line and accordingly makes it possible to achieve input/output of data without resulting in an increase in wiring layer.

Further, turning the replica bit lines RLB and RBLB into static circuits enhances the resistance to noise and creates surer timings of data transfer more than the third embodiment.

Fifth Embodiment

Figure 17:
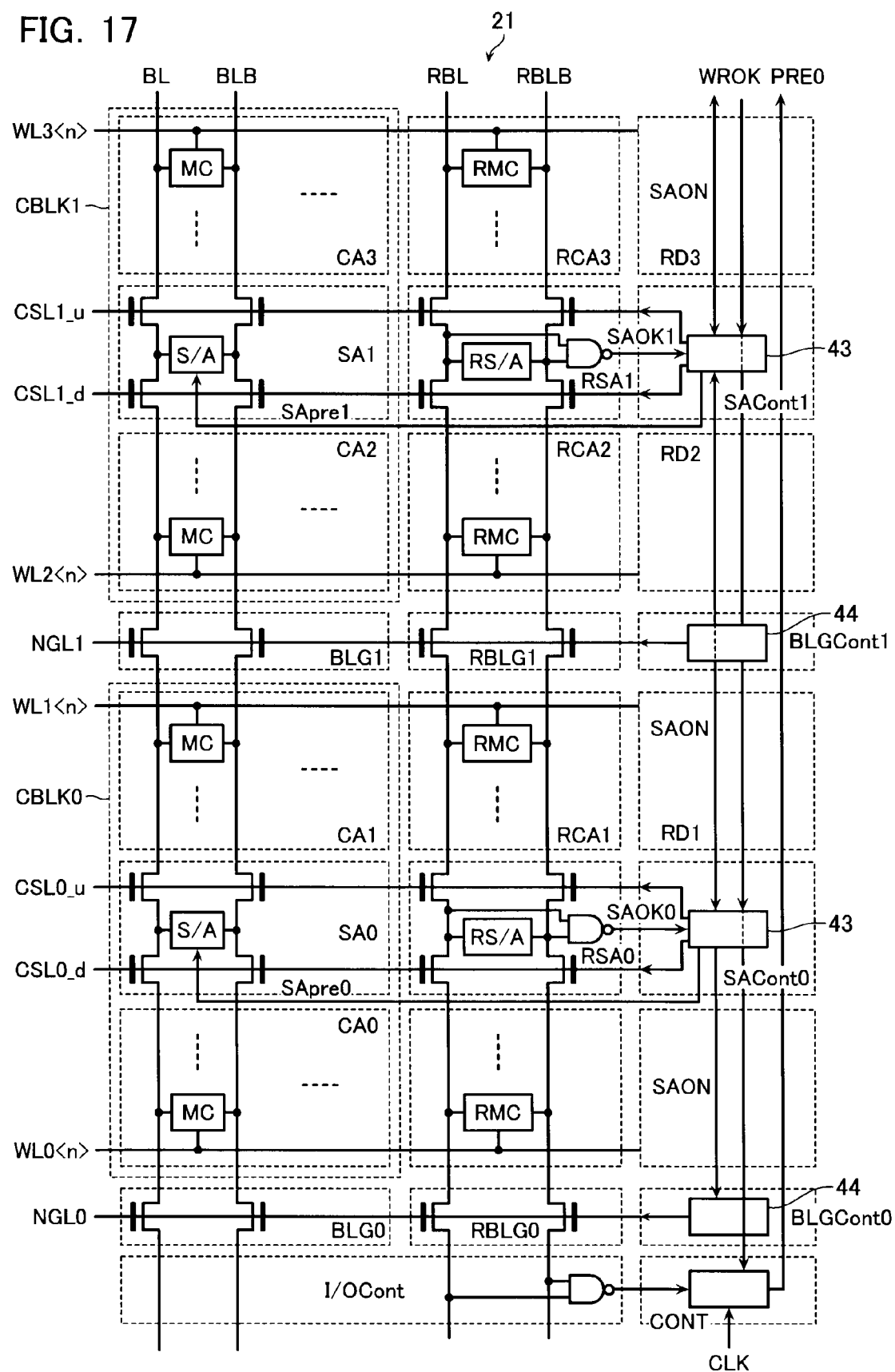
FIG. 17 is a block diagram of a semiconductor memory device according to a fifth embodiment of the present invention.

FIG. 17 is a block diagram of a semiconductor memory device according to a fifth embodiment of the present invention.

The present embodiment includes a bit line gate transfer permission circuit 44 provided in the bit line gate controller BLGCont, different from the third embodiment.

The bit line gate transfer permission circuit 44 is a circuit operative to turn on the bit line gate BLG at the reception timing of the sense amplifier activation permission signal SAON.

In the semiconductor memory device thus configured, the sense amplifier activation permission signal SAON given from a transfer permission circuit 43 contained in the sense amplifier controller SACont turns on the column gates 2a and 2b in an adjacent sense amplifier unit SA to activate the sense amplifier circuit S/A. In addition, it turns on the bit line gate BLG provided between the cell block and an adjacent one at the same timing via the bit line gate transfer permission circuit 44.

As described above, in the third embodiment, all the bit line gates are turned on at once. Accordingly, the sense amplifier circuit S/A is susceptible to the influence by the bit line capacity in an adjacent cell array CA. On the other hand, in the present embodiment, the bit line gates BLG are turned off.

Accordingly, the bit line capacity in an adjacent cell array CA can be prevented from exerting the influence.

The present embodiment uses no global bit line and accordingly makes it possible to achieve input/output of data without resulting in an increase in wiring layer.

Further, when the sense amplifier circuit S/A senses data in the memory cell MC, the cell block is isolated from an adjacent one, thereby reducing the bit line capacity and improving the resistance to disturb of the memory cell MC more than the third embodiment.

Sixth Embodiment

Figure 18:
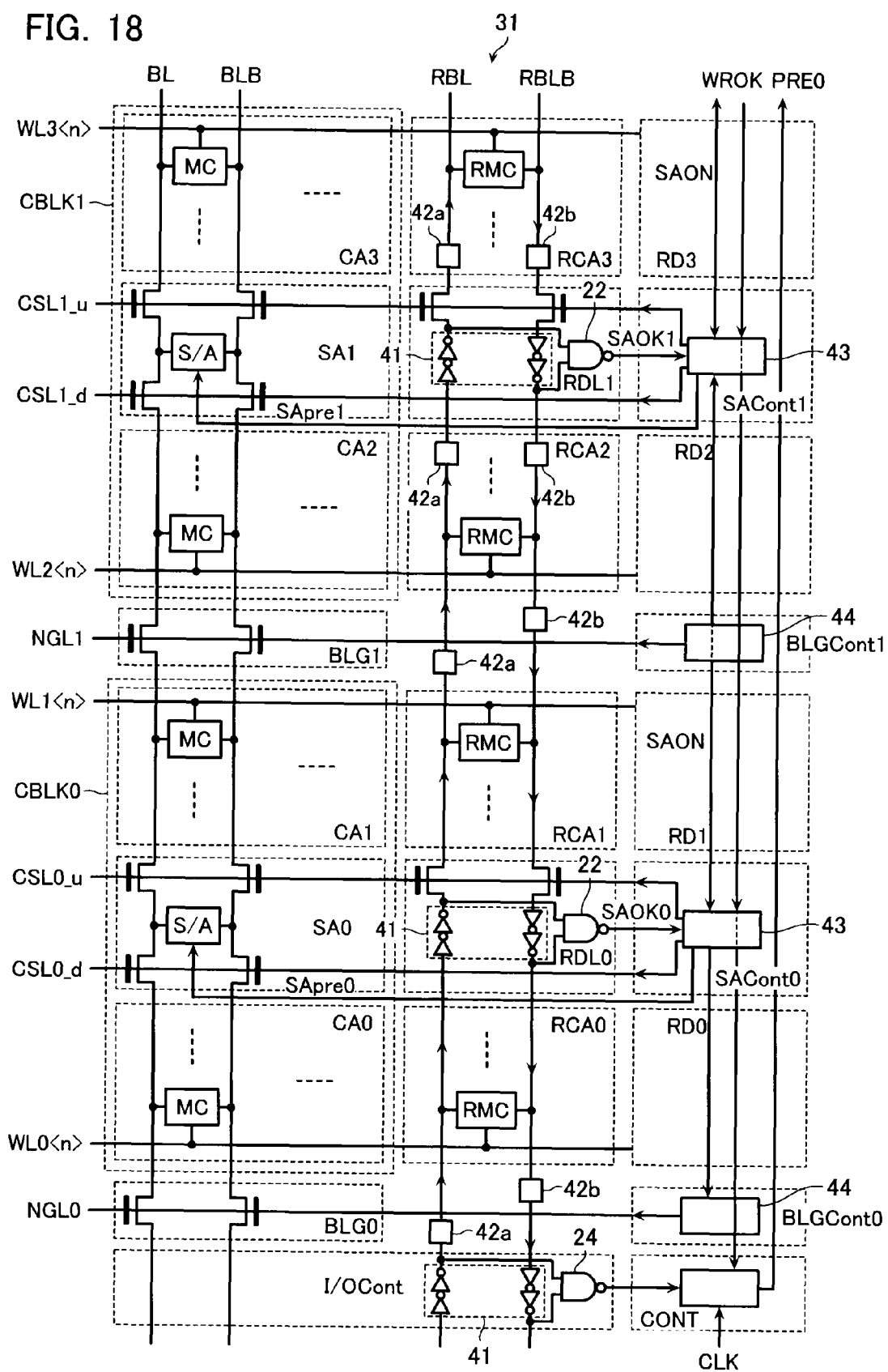
FIG. 18 is a block diagram of a semiconductor memory device according to a sixth embodiment of the present invention.

FIG. 18 is a block diagram of a semiconductor memory device according to a sixth embodiment of the present invention.

The present embodiment uses the bit line gate transfer permission circuit 44 contained in the semiconductor memory device according to the fifth embodiment, in addition to the fourth embodiment.

Specific operation is similar to those in the fourth and fifth embodiments.

The present embodiment uses no global bit line and accordingly makes it possible to achieve input/output of data without resulting in an increase in wiring layer.

In addition, the static circuits 42a and 42b are added to the paired replica bit lines, thereby reducing the influence by noises.

Further, when the sense amplifier S/A senses data, the cell block is isolated from an adjacent one CBLK, thereby reducing the bit line capacity and improving the stability additionally.

Seventh Embodiment

Figure 19:
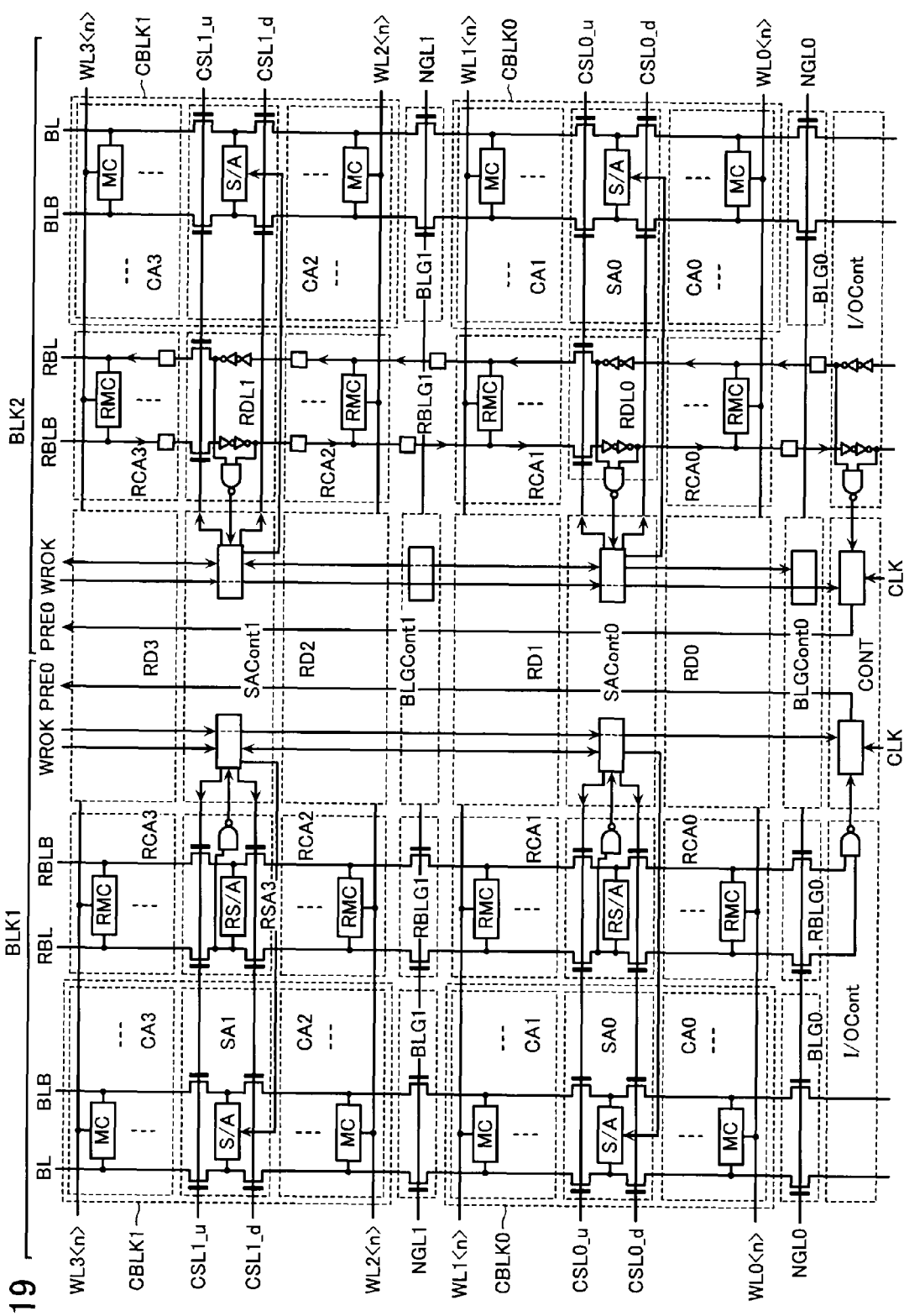
FIG. 19 is a block diagram of a semiconductor memory device according to a seventh embodiment of the present invention.

FIG. 19 is a block diagram of a semiconductor memory device according to a seventh embodiment of the present invention.

The semiconductor memory device of the present embodiment comprises first and second functional blocks BLK1 and BLK2.

The first functional block BLK1 has a configuration equal to the semiconductor memory device according to the third embodiment while the second functional block BLK2 has a configuration equal to the semiconductor memory device according to the sixth embodiment.

In the present embodiment, operation of the first and second functional blocks BLK1 and BLK2 is similar to that of the semiconductor memory devices according to the third and sixth embodiments though the first and second functional blocks BLK1 and BLK2 can be used selectively as one characteristic. In a word, a system placing emphasis on the operation speed can use the first functional block BLK1 with a smaller bit line capacity while a system placing emphasis on the resistance to noise with stability can selectively use BLK2 with the static-added replica bit line pair.

The present embodiment uses no global bit line and accordingly makes it possible to achieve input/output of data without resulting in an increase in wiring layer and can provide a semiconductor memory device ready for much more use purposes.

Others

In the above embodiments, at least one of the first and second column gates 2a, 2b and the bit line gate BLG may comprise a PMOS transistor or an NMOS transistor, or a PMOS transistor and an NMOS transistor.

Alternatively, at least one of the first and second column gates 2a, 2b and the bit line gate BLG may comprise a path gate including a PMOS transistor and an NMOS transistor connected in parallel.

Further, a PMOS transistor or an NMOS transistor contained in at least one of the first and second column gates 2a, 2b and the bit line gate BLG and that contained in at least one of the cell array CA and the sense amplifier circuit S/A may have different thresholds.

In any of the above cases, the cell current and the capacity on the bit line connected to the sense amplifier circuit S/A can be designed in accordance with the bit line voltage.

What is claimed is:

1. A semiconductor memory device, comprising:
a plurality of cell arrays, each cell array containing a plurality of word lines, a plurality of bit lines crossing said word lines, and memory cells connected at intersections of said word lines and bit lines, said cell arrays arranged along said bit line;
an input/output controller provided on at least one side of an array of said cell arrays along said bit line and operative to control input/output of data in relation to access to a memory cell;
a plurality of bit line gates provided between said cell arrays and between said input/output controller and an adjacent cell array, each being operative to establish a connection between said bit lines in adjacent cell arrays, and between said input/output controller and said bit line in said adjacent cell array; and
a controlling circuit operative to form a data transfer path between said memory cell and said input/output controller by opening said bit line gates sequentially along a direction of data transfer, thereby establishing an electrical connection sequentially between said bit line in an adjacent pair of said cell arrays and between said input/output controller and said bit line in said adjacent cell array when said controlling circuit accesses to said memory cell.

2. The semiconductor memory device according to claim 1, wherein said bit line gate:
is configured by a path gate containing an NMOS transistor and a PMOS transistor connected in parallel by connection of sources and drains of said NMOS and PMOS transistors, or
is configured by an NMOS transistor.

3. A semiconductor memory device, comprising:
a plurality of cell blocks, each cell block including
a first and a second cell array, each cell array containing a plurality of word lines, a plurality of bit lines crossing said word lines, and memory cells connected at intersections of said word lines and bit lines, said first and second cell arrays arranged along said bit line,
a sense amplifier circuit connected to sense nodes located between said first and second cell arrays, and
a first and a second column gate arranged to connect bit lines in said first and second cell arrays to said sense nodes,
said cell blocks arranged along said bit line to form an array of said cell block;
an input/output controller provided on at least one side of the array of said cell blocks along the bit line and operative to control input/output of data in relation to access to a memory cell;
a plurality of bit line gates provided between said cell blocks and between said input/output controller and an adjacent cell block and operative to establish connections between bit lines in adjacent cell blocks and between bit lines in said input/output controller and said adjacent cell block;

a row decoder arranged on one side of said cell blocks along said word line and operative to select among said word lines; and a controlling circuit operative to form a data transfer path between said memory cell and said input/output controller via said connection between said bit lines formed through said first and second column gates and said bit line gate when said controlling circuit accesses to said memory cell.

4. The semiconductor memory device according to claim 3, wherein said sense amplifier circuit includes a first transistor of the first conduction type having a gate connected to said sense node, a second transistor of the second conduction type having a source connected to a first power supply, a drain connected to said sense node, and a gate connected to the drain of said first transistor, a third transistor of the second conduction type having a source connected to the first power supply, a drain connected to the drain of said first transistor, and a gate connected to a control signal line, and a fourth transistor of the first conduction type having a source connected to a second power supply, a drain connected to the source of said first transistor, and a gate connected to said control signal line, said sense amplifier circuit is activated with a control signal given to said control signal line.

5. The semiconductor memory device according to claim 4, wherein said memory cell includes a first and a second inverter, each including a load transistor and a drive transistor, with the input of the one connected to the output of the other and the output of the one connected to the input of the other, and transfer transistors arranged to connect said first and second inverters with said bit lines, said first transistor in said sense amplifier circuit has a larger driving force than said drive transistor in said first inverter.

6. The semiconductor memory device according to claim 3, wherein said sense nodes comprise a sense node pair including first and second sense nodes, said sense amplifier circuit is a differential amplifier including a third inverter having an input and an output connected to said first and second sense nodes, a fourth inverter having an output and an input connected to said first and second sense nodes, and a switch means operative to activate said third and fourth inverters in accordance with a control signal.

7. The semiconductor memory device according to claim 3, wherein said controlling circuit has control of activating said first and second column gates and said bit line gates.

8. The semiconductor memory device according to claim 3, wherein said controlling circuit has control of activating said first and second column gates sequentially with a certain delay time in accordance with the direction of data transfer.

9. The semiconductor memory device according to claim 8, wherein said controlling circuit activates all said bit line gates on getting access to said memory cell, then determines data in relation to access from the sense amplifier circuit, in a certain cell block between the cell block containing the memory cell to be accessed and the cell block adjacent to said input/output controller, and then activates said first and second column gates in the next cell block in accordance with the direction of data transfer.

10. The semiconductor memory device according to claim 8, wherein said controlling circuit determines data in relation to access from the sense amplifier circuit on getting access to said memory cell, in a certain cell block between the cell block containing the memory cell to be accessed and the cell block adjacent to said input/output controller, and then activates said bit line gates between said certain cell block and the next cell block in accordance with the direction of data transfer.

11. The semiconductor memory device according to claim 8, wherein said controlling circuit includes a replica circuit provided on one end of said cell blocks along said word line, containing replica memory cells and replica sense amplifier circuits corresponding to the memory cells and the sense amplifier circuits contained in and configured equally to said cell block, and a transfer permission circuit operative to activate the next cell block in accordance with the direction of data transfer, and the next replica sense amplifier circuit corresponding thereto, after said replica sense amplifier circuit determines data.

12. The semiconductor memory device according to claim 8, wherein said controlling circuit includes a replica circuit provided on one end of said cell blocks along said word line, containing replica memory cells, replica bit lines and replica delay circuits corresponding to the memory cells, the bit lines and the sense amplifier circuits contained in said cell block, said replica memory cell configured equally to said memory cell, said replica delay circuit having the same delay time as said sense amplifier circuit and containing a plurality of inverters serially interposed in said replica bit lines, and a transfer permission circuit operative to activate the next cell block in accordance with the direction of data transfer after said replica delay circuit transfers data.

13. The semiconductor memory device according to claim 12, wherein said replica bit line includes a static circuit comprises a transistor of the second conduction type having a current path serially interposed in said replica bit line, an inverter having an input and an output connected to the source and the gate of said transistor of the second conduction type, respectively, and a transistor of the first conduction type having a current path connected to a power supply and the drain of said transistor of the second conduction type, and a gate connected to the output of said inverter.

14. The semiconductor memory device according to claim 3, wherein said bit line gate includes a path gate containing an NMOS transistor and a PMOS transistor connected in parallel, or an NMOS transistor.

15. The semiconductor memory device according to claim 3, wherein said first and second column gates each includes a path gate containing an NMOS transistor and a PMOS transistor connected in parallel, or an NMOS transistor.

16. A semiconductor memory device, comprising:

a plurality of cell blocks, each cell block including a first and a second cell array, each cell array containing a plurality of word lines, a plurality of bit lines crossing said word lines, and memory cells connected at intersections of said word lines and bit lines, said first and second cell arrays arranged along said bit line, a sense amplifier circuit connected to sense nodes located between said first and second cell arrays, and a first and a second column gate arranged to connect bit lines in said first and second cell arrays to said sense nodes, said cell blocks arranged along said bit line to form an array of said cell blocks;

an input/output controller provided on at least one side of the array of said cell blocks along the bit line and operative to control input/output of data in relation to access to said memory cell; and a plurality of bit line gates provided between said cell blocks and between said input/output controller and an adjacent cell block and operative to establish connections between bit lines in adjacent cell blocks and between bit lines in said input/output controller and said adjacent cell block, wherein access to a certain memory cell is made via a data transfer path including the bit lines, the first and second column gates and said bit line gates in said cell block arranged between a certain cell block containing said certain memory cell and said input/output controller.

17. The semiconductor memory device according to claim 16, wherein said sense amplifier circuit includes a first transistor of the first conduction type having a gate connected to said sense node, a second transistor of the second conduction type having a source connected to a first power supply, a drain connected to said sense node, and a gate connected to the drain of said first transistor, a third transistor of the second conduction type having a source connected to the first power supply, a drain connected to the drain of said first transistor, and a gate connected to a control signal line, and a fourth transistor of the first conduction type having a source connected to a second power supply, a drain connected to the source of said first transistor, and a gate connected to said control signal line, said sense amplifier circuit is activated with a control signal given to said control signal line.

18. The semiconductor memory device according to claim 17, wherein said memory cell includes a first and a second inverter, each including a load transistor and a drive transistor, with the input of the one connected to the output of the other and the output of the one connected to the input of the other, and transfer transistors arranged to connect said first and second inverters with said bit lines, said first transistor in said sense amplifier circuit has a larger driving force than said drive transistor in said first inverter.

19. The semiconductor memory device according to claim 16, wherein said sense nodes comprise a sense node pair including first and second sense nodes, said sense amplifier circuit is a differential amplifier including a third inverter having an input and an output connected to said first and second sense nodes, a fourth inverter having an output and an input connected to said first and second sense nodes, and a switch means operative to activate said third and fourth inverters in accordance with a control signal.

20. The semiconductor memory device according to claim 16, wherein said first and second column gates each includes a path gate containing an NMOS transistor and a PMOS transistor connected in parallel, or an NMOS transistor.

* * * * *